(12) United States Patent
Tsutsumi et al.

(10) Patent No.: US 10,594,295 B2
(45) Date of Patent: Mar. 17, 2020

(54) RESONATOR DEVICE, ELECTRONIC APPARATUS, AND VEHICLE

(71) Applicant: Seiko Epson Corporation, Tokyo (JP)

(72) Inventors: Akio Tsutsumi, Chino (JP); Takashi Kurashina, Matsumoto (JP); Fumikazu Komatsu, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/021,092

(22) Filed: Jun. 28, 2018

(65) Prior Publication Data

US 2019/0007027 A1    Jan. 3, 2019

(30) Foreign Application Priority Data

Jun. 29, 2017   (JP) .................................. 2017-126937

(51) Int. Cl.

| | |
|---|---|
| *H03H 9/205* | (2006.01) |
| *H03B 5/32* | (2006.01) |
| *H03B 5/02* | (2006.01) |
| *H01L 23/00* | (2006.01) |
| *H03H 9/13* | (2006.01) |

(Continued)

(52) U.S. Cl.
CPC .......... *H03H 9/205* (2013.01); *G04F 10/005* (2013.01); *H01L 24/16* (2013.01); *H01L 24/48* (2013.01); *H03B 5/02* (2013.01); *H03B 5/32* (2013.01); *H03B 5/362* (2013.01); *H03B 5/368* (2013.01); *H03H 9/13* (2013.01); *H01L 2224/1319* (2013.01); *H01L 2224/13644* (2013.01); *H01L 2224/16265* (2013.01); *H01L 2224/48011* (2013.01); *H01L 2224/48265* (2013.01); *H01L 2924/00014* (2013.01); *H03H 9/0519* (2013.01)

(58) Field of Classification Search
CPC ... H03B 5/32; H03B 5/04; H03B 5/02; H03H 9/025; H01L 41/053; H03L 1/028; H03L 1/027
See application file for complete search history.

(56) References Cited

U.S. PATENT DOCUMENTS 6,833,654 B2 * 12/2004 Rubach ................ H03H 9/0547
  310/344
7,271,525 B2 *  9/2007 Byers ................... H03H 9/1021
  310/330

(Continued)

FOREIGN PATENT DOCUMENTS

| JP | 05-087954 A | 4/1993 |
|---|---|---|
| JP | 2003-309296 A | 10/2003 |

*Primary Examiner* — Ryan Johnson
(74) *Attorney, Agent, or Firm* — Harness, Dickey & Pierce, P.L.C.

(57) ABSTRACT

A resonator device includes first and second resonators and an integrated circuit. The integrated circuit includes first and second oscillation circuits that oscillate first and second resonators, first and second terminals connected to the first oscillation circuit, and third and fourth terminals connected to the second oscillation circuit. The first terminal of the integrated circuit and one electrode of the first resonator are connected to each other via a bump. The third terminal and one electrode of the second resonator are connected to each other via a bump. In a plan view, at least a portion of the first resonator overlaps the first oscillation circuit and at least a portion of the second resonator overlaps the second oscillation circuit.

18 Claims, 15 Drawing Sheets

(51) Int. Cl.
*G04F 10/00* (2006.01)
*H03B 5/36* (2006.01)
*H03H 9/05* (2006.01)

(56) References Cited

U.S. PATENT DOCUMENTS

| | | | | |
|---|---|---|---|---|
| 7,493,505 B2* | 2/2009 | Leung | ................... | G06F 1/3203 |
| | | | | 713/323 |
| 2005/0012561 A1* | 1/2005 | Young | ..................... | H03L 1/022 |
| | | | | 331/176 |
| 2014/0159821 A1* | 6/2014 | Yorita | ....................... | H03L 7/06 |
| | | | | 331/16 |
| 2018/0191303 A1* | 7/2018 | Kojo | ........................ | H03B 5/32 |

* cited by examiner

RESONATOR DEVICE, ELECTRONIC APPARATUS, AND VEHICLE

BACKGROUND

1. Technical Field

The present invention relates to a resonator device, an electronic apparatus, and a vehicle.

2. Related Art

In a resonator device that oscillates a resonator such as a piezoelectric resonator so as to generate a clock signal, size reduction is required. For example, JP-A-2003-309296 discloses an integrated circuit device in which an integrated circuit including a piezoelectric resonator, a clock signal generation circuit, and a CPU are mounted on a chip board, and thus one chip is achieved by integrally integrating the integrated circuit including the piezoelectric resonator. The clock signal generation circuit is connected to the piezoelectric resonator and generates a clock signal, and the CPU operates based on the generated clock signal.

JP-A-5-87954 discloses a technology of realizing time-digital conversion by using two crystal oscillators. In the technology disclosed in JP-A-5-87954, first and second clock signals (clock pulses) are generated by the two crystal oscillators and an edge coincidence detection circuit detects a synchronization point at which falling edges of the first and second clock signals coincide with each other. In a case where the synchronization point is detected, a synchronization counter starts a counting process with synchronizing the first and second clock signals and thus performs time measurement of calculating the unknown time from the start pulse to the stop pulse based on the result of the counting processing.

In the technology disclosed in JP-A-5-87954, each of the two crystal oscillators that generate the first and second clock signals is realized by crystal oscillators of independent packages. Thus, it is difficult to realize a reduction in the size of the device. In addition, since parasitic resistance and parasitic capacitance of a clock signal line that connects the crystal oscillators to an IC chip or circuit components increase, a problem such as degradation of performance may occur. In the technology in JP-A-2003-309296, only one resonator is mounted on the integrated circuit and an arrangement configuration or a connection configuration of allowing compact accommodation of two resonators or more has not been proposed.

SUMMARY

An advantage of some aspects of the invention is to solve at least a part of the problems described above, and the invention can be implemented as the following aspects.

An aspect of the invention relates to a resonator device including a first resonator, a second resonator, and an integrated circuit device. The integrated circuit device includes a first oscillation circuit that oscillates the first resonator, a second oscillation circuit that oscillates the second resonator, a first terminal connected to the first oscillation circuit, a second terminal connected to the first oscillation circuit, a third terminal connected to the second oscillation circuit, and a fourth terminal connected to the second oscillation circuit. The first terminal of the integrated circuit device and one electrode of the first resonator are connected to each other with a bump. The third terminal of the integrated circuit device and one electrode of the second resonator is connected to each other with a bump. At least a portion of the first resonator overlaps the first oscillation circuit in plan view in a direction perpendicular to a board of the integrated circuit device. At least a portion of the second resonator overlaps the second oscillation circuit in the plan view.

According to the aspect of the invention, the first and second oscillation circuits that oscillate the first and second resonators are provided in the integrated circuit device. The first terminal connected to the first oscillation circuit of the integrated circuit device and one electrode of the first resonator are connected to each other with a bump. The third terminal connected to the second oscillation circuit and one electrode of the second resonator are connected to each other with a bump. Further, in plan view, the first resonator and the first oscillation circuit are disposed to overlap each other, and the second resonator and the second oscillation circuit are disposed to overlap each other. According to this configuration, it is possible to mount the first and second resonators on the integrated circuit device while being supported in places in which bump connection is performed, and to connect the first and second oscillation circuits and the first and second resonators with a short connection path. Thus, it is possible to provide a small resonator device and the like which are capable of compactly accommodating the first and second resonators and the integrated circuit device.

In the aspect of the invention, at least one of connecting the second terminal of the integrated circuit device and the other electrode of the first resonator by a bonding wire and connecting the fourth terminal of the integrated circuit device and the other electrode of the second resonator by a bonding wire may be performed.

According to this configuration, it is possible to connect the oscillation circuit of the integrated circuit device and the resonator by bump connection and wire-bonding connection and to resonate the resonator.

In the aspect of the invention, the second terminal of the integrated circuit device and a terminal electrode of the other electrode of the first resonator may be connected to each other by a first bonding wire. The terminal electrode of the other electrode of the first resonator and a terminal electrode of the one electrode thereof may overlap the first terminal of the integrated circuit device in the plan view.

According to this configuration, it is possible to mount the first resonator on the integrated circuit device while being supported at a single point in a place in which bump connection is performed, and to suppress deterioration and the like of characteristics due to thermal stress.

In the aspect of the invention, the fourth terminal of the integrated circuit device and a terminal electrode of the other electrode of the second resonator may be connected to each other by a second bonding wire. The terminal electrode of the other electrode of the second resonator and a terminal electrode of the one electrode thereof may overlap the third terminal of the integrated circuit device in the plan view.

According to this configuration, it is possible to mount the second resonator on the integrated circuit device while being supported at a single point in a place in which bump connection is performed, and to suppress deterioration and the like of characteristics due to thermal stress.

In the aspect of the invention, at least one of connecting the second terminal of the integrated circuit device and the one electrode of the first resonator with a bump and connecting the fourth terminal of the integrated circuit device and the one electrode of the second resonator with a bump may be performed.

According to this configuration, it is possible to mount the resonator on the integrated circuit device while being supported in two places in which bump connection is performed.

In the aspect of the invention, the resonator device may include a third resonator. The integrated circuit device may include a third oscillation circuit that oscillates the third resonator, a fifth terminal that connects the third resonator and the third oscillation circuit, and a sixth terminal that connects the third resonator and the third oscillation circuit. The fifth terminal of the integrated circuit device and one electrode of the third resonator may be connected to each other with a bump.

According to this configuration, it is possible to provide a small resonator device and the like in which the third resonator is mounted on the integrated circuit device in a place in which bump connection is performed, while being supported, and the first to third resonators and the integrated circuit device can be compactly accommodated.

In the aspect of the invention, the first resonator and the second resonator may be disposed to set a longitudinal direction in the plan view to be a first direction. The third resonator may be disposed to set a longitudinal direction in the plan view to be a second direction intersecting with the first direction.

According to this configuration, the first to third resonators can be disposed with being efficiently mounted on the integrated circuit device.

In the aspect of the invention, the second terminal of the integrated circuit device and a terminal electrode of the other electrode of the first resonator connected to the second terminal may be disposed with a side interposed therebetween, the side being the closest to the second terminal among a plurality of sides of the first resonator, in the plan view.

According to this configuration, it is possible to connect the second terminal of the integrated circuit device and the terminal electrode of the other electrode of the first resonator with a short connection path and to suppress degradation of characteristics and the like.

In the aspect of the invention, the fourth terminal of the integrated circuit device and a terminal electrode of the other electrode of the second resonator connected to the fourth terminal may be disposed with a side interposed therebetween, the side being the closest to the fourth terminal among a plurality of sides of the second resonator, in the plan view.

According to this configuration, it is possible to connect the fourth terminal of the integrated circuit device and the terminal electrode of the other electrode of the second resonator with a short connection path and to suppress degradation of characteristics and the like.

In the aspect of the invention, the integrated circuit device may include a processing circuit that performs processing based on a first clock signal generated by oscillating the first resonator and a second clock signal generated by oscillating the second resonator.

According to this configuration, it is possible to perform various kinds of processing using the first and second clock signals having high precision, by the processing circuit.

In the aspect of the invention, the processing circuit may include a control unit that controls at least one of an oscillation frequency and a phase of an oscillation signal from at least one of the first oscillation circuit and the second oscillation circuit.

If the oscillation frequency and the phase of the oscillation signal are controlled, the frequency relationship and the phase relationship of the first and second clock signals can be suitably set.

In the aspect of the invention, the processing circuit may include a time-digital conversion circuit that converts a time to a digital value based on the first clock signal and the second clock signal.

According to this configuration, it is possible to realize time-digital conversion processing with high accuracy using the first and second clock signals.

In the aspect of the invention, the processing circuit may include a frequency correction unit that performs frequency correction processing based on the frequency difference information or the frequency comparison information between the first clock signal and the second clock signal.

According to this configuration, it is possible to realize frequency correction processing having high accuracy with the frequency difference information or the frequency comparison information between the first and second clock signals.

In the aspect of the invention, the frequency correction unit may perform compensation processing of temperature characteristics at the oscillation frequency, based on the frequency difference information or the frequency comparison information.

According to this configuration, it is possible to suppress fluctuation of the oscillation frequency occurring by temperature fluctuation, by using the frequency difference information or the frequency comparison information between the first and second clock signals.

Another aspect of the invention relates to an electronic apparatus including the resonator device described above.

Still another aspect of the invention relates to a vehicle including the resonator device described above.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a preferred embodiment of the invention will be described in detail. The embodiment which will be described below does not limit the contents of the invention described in the appended claims, and all of the configurations described in the embodiment are not indispensable as means for achieving the invention.

1. Resonator Device

Figure 1:
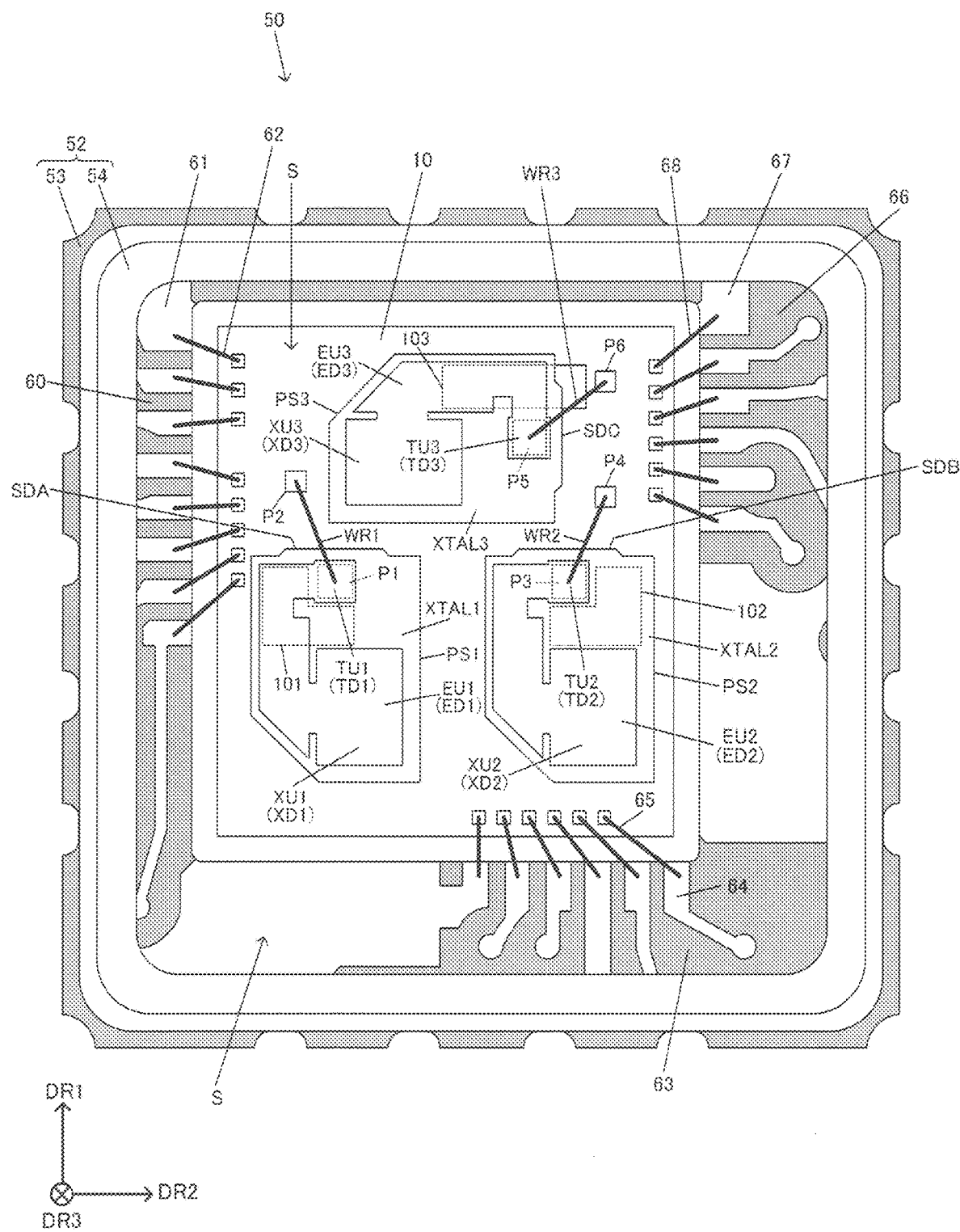
FIG. 1 is a plan view illustrating a configuration example of a resonator device according to an embodiment.
Figure 2:
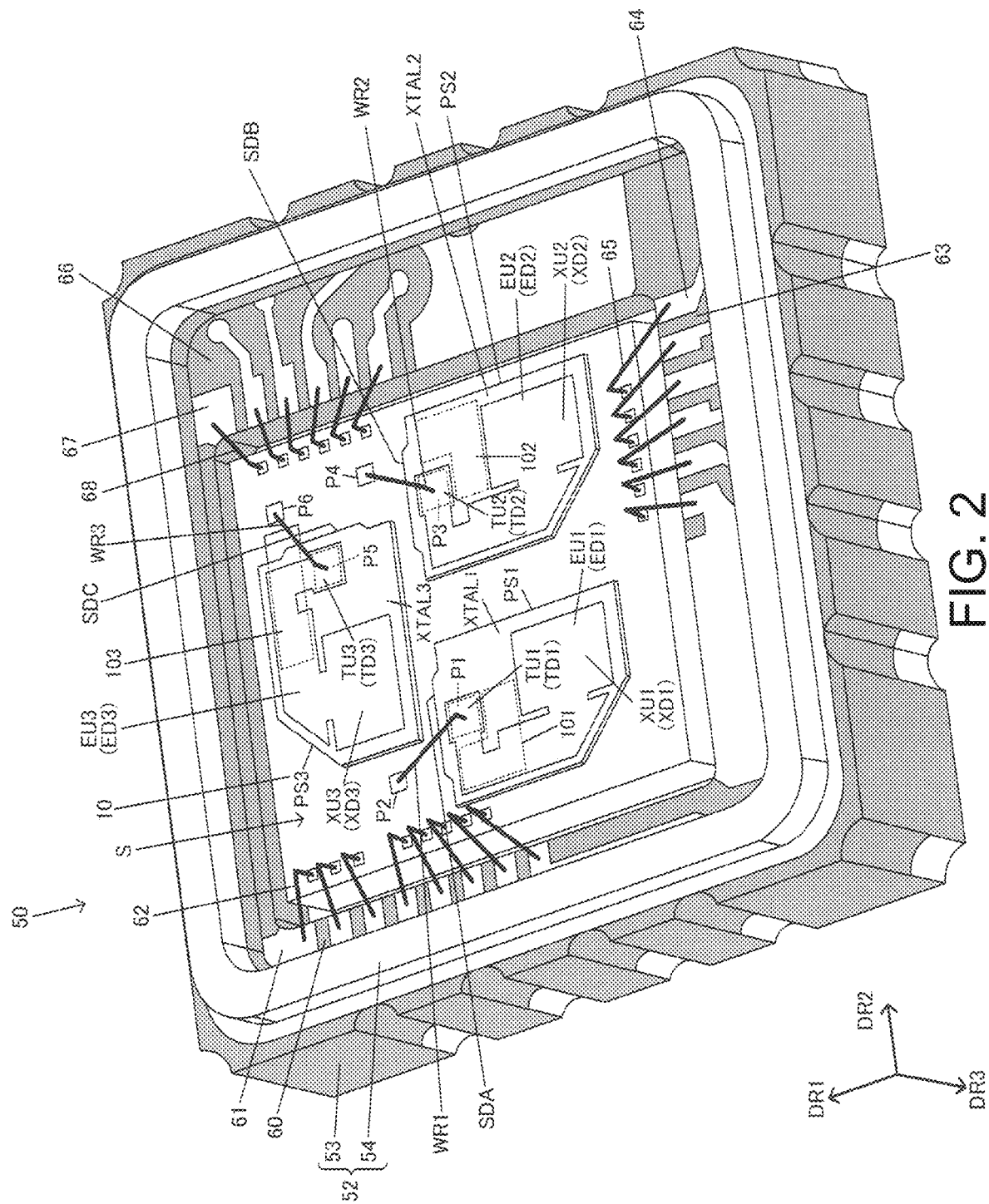
FIG. 2 is a perspective view illustrating the configuration example of the resonator device in the embodiment.

FIGS. 1 and 2 illustrate a configuration example of a resonator device 50 in the embodiment. FIG. 1 is a plan view when the resonator device 50 is viewed from the top. FIG. 2 is a perspective view when the resonator device is obliquely viewed from the top. The resonator device 50 includes resonators XTAL1 and XTAL2 (first and second resonators) and an integrated circuit device 10 (an integrated circuit). The resonator device may further include a resonator XTAL3 (third resonator). FIGS. 1 and 2 illustrate the configuration example in which three resonators are provided in the resonator device 50. However, the embodiment is not limited thereto. The number of resonators may be 2 or may be 4 or greater.

In the embodiment, a direction extending from the integrated circuit device 10 to the resonators XTAL1 to XTAL3 is set to be an upward direction and the opposite direction is set to be a downward direction. For example, a lid side of a package 52 of the resonator device 50 corresponds to the upward direction side and a bottom side corresponds to the downward direction side. In FIGS. 1 and 2, a direction DR3 (third direction) corresponds to the downward direction and to a direction perpendicular (intersecting with) to a substrate (semiconductor substrate) of the integrated circuit device (semiconductor chip) 10 provided in the resonator device 50. The directions DR1 and DR2 (first and second directions) are directions perpendicular to the direction DR3. The directions DR1 and DR2 are perpendicular to each other. The direction DR1 corresponds to a direction along a first side of the package 52 of the resonator device 50. The direction DR2 corresponds to a direction along a second side of the package 52, which is perpendicular to the first side.

The resonator device 50 has the package 52. The package 52 has a box-like base 53 and a frame (surrounding portion) 54. The lid (not illustrated) is bonded to the upper surface of the frame 54. A recess is provided in the base 53 of the package 52. The resonators XTAL1 to XTAL3 and the integrated circuit device 10 are accommodated in an accommodation space S formed by the recess, and air-tightly sealed by the lid.

Steps 60, 63, and 66 are provided at the inner circumference of the frame 54 of the package 52. The recess of the base 53 has a two-stage structure (loft structure) of an inner bottom surface and the steps 60, 63, and 66. The integrated circuit device 10 is mounted on the inner bottom surface thereof. A plurality of electrodes such as electrodes 61, 64, and 67 are formed at each of the steps 60, 63, and 66. The electrodes 61, 64, and 67 are electrically connected to the corresponding terminals (pads) of the integrated circuit device 10 via bonding wires 62, 65, and 68. The electrodes 61, 64, and 67 are electrically connected to external connection terminals provided on an outer bottom surface (outside bottom surface) of the package 52, via an internal wire and the like of the package 52. Thus, the terminal of the integrated circuit device 10 is electrically connected to the external connection terminal.

The resonators XTAL1, XTAL2, and XTAL3 are realized, for example, by resonator elements (piezoelectric resonator elements) such as crystal resonator elements. For example, the resonators are realized by crystal resonator elements and the like which have a cut angle of AT cut, SC cut, or the like and perform thickness shear mode resonance. The resonators XTAL1, XTAL2, and XTAL3 in the embodiment are not limited thereto. For example, the resonators can be realized by various resonator elements such as resonator elements (other than a thickness shear mode type) or piezoelectric resonator elements formed of a material other than quartz.

The resonator XTAL1 includes a substrate PS1 (piezoelectric substrate), an upper electrode EU1 (the other electrode in a broad sense), and a lower electrode ED1 (one electrode in a broad sense, and not illustrated). The substrate PS1 is a flat substrate formed of a piezoelectric material such as quartz. The upper electrode EU1 (front electrode) is formed on the upper surface (first main surface) of the substrate PS1. The lower electrode ED1 (back electrode) is formed on the lower surface (second main surface) of the substrate PS1. The upper electrode EU1 includes a rectangular (substantially rectangular) excitation electrode XU1, a rectangular (substantially rectangular) terminal electrode TU1, and a connection electrode that connects the excitation electrode XU1 and the terminal electrode TU1. The lower electrode ED1 includes an excitation electrode XD1, a terminal electrode TD1, and a connection electrode which are not illustrated. The excitation electrode XU1 of the upper electrode EU1 is provided to face the excitation electrode XD1 of the lower electrode ED1 with the substrate PS1 interposed between the excitation electrodes XU1 and XD1. The terminal electrode TU1 of the upper electrode EU1 is provided to face the terminal electrode TD1 of the lower electrode ED1 with the substrate PS1 interposed between the terminal electrodes TU1 and TD1. Thus, resonance by thickness shear is realized by applying a voltage between the excitation electrodes XU1 and XD1. In this case, a structure in which the thickness of the substrate PS1 between the excitation electrodes XU1 and XD1 (thickness thereof in the direction DR3) is thin can be employed. As described above, the resonator XTAL1 in the embodiment has a structure in which the terminal electrodes TU1 and TD1 and the connection electrode are formed on the substrate PS1 so as to be adhered to the substrate PS1 (by being stacked or by vapor deposition) in addition to the excitation electrodes XU1 and XD1.

The resonator XTAL2 includes a substrate PS2, an upper electrode EU2 (the other electrode), and a lower electrode ED2 (one electrode). The upper electrode EU2 includes an excitation electrode XU2, a terminal electrode TU2, and a connection electrode. The lower electrode ED2 includes an excitation electrode XD2, a terminal electrode TD2, and a connection electrode. The resonator XTAL3 includes a substrate PS3, an upper electrode EU3 (the other electrode), and a lower electrode ED3 (one electrode). The upper electrode EU3 includes an excitation electrode XU3, a terminal electrode TU3, and a connection electrode. The lower electrode ED3 includes an excitation electrode XD3, a terminal electrode TD3, and a connection electrode. The structures of the resonators XTAL2 and XTAL3 regarding the electrode and the like are similar to that of the resonator XTAL1, and detailed descriptions thereof will not be repeated. The lower electrodes ED1, ED2, and ED3 as the one electrodes are, for example, electrodes on the third direction side (integrated circuit device side). The upper electrodes EU1, EU2, and EU3 as the other electrodes are, for example, electrodes on a fourth direction side which is a direction opposite to the third direction (DR3).

Figure 3:
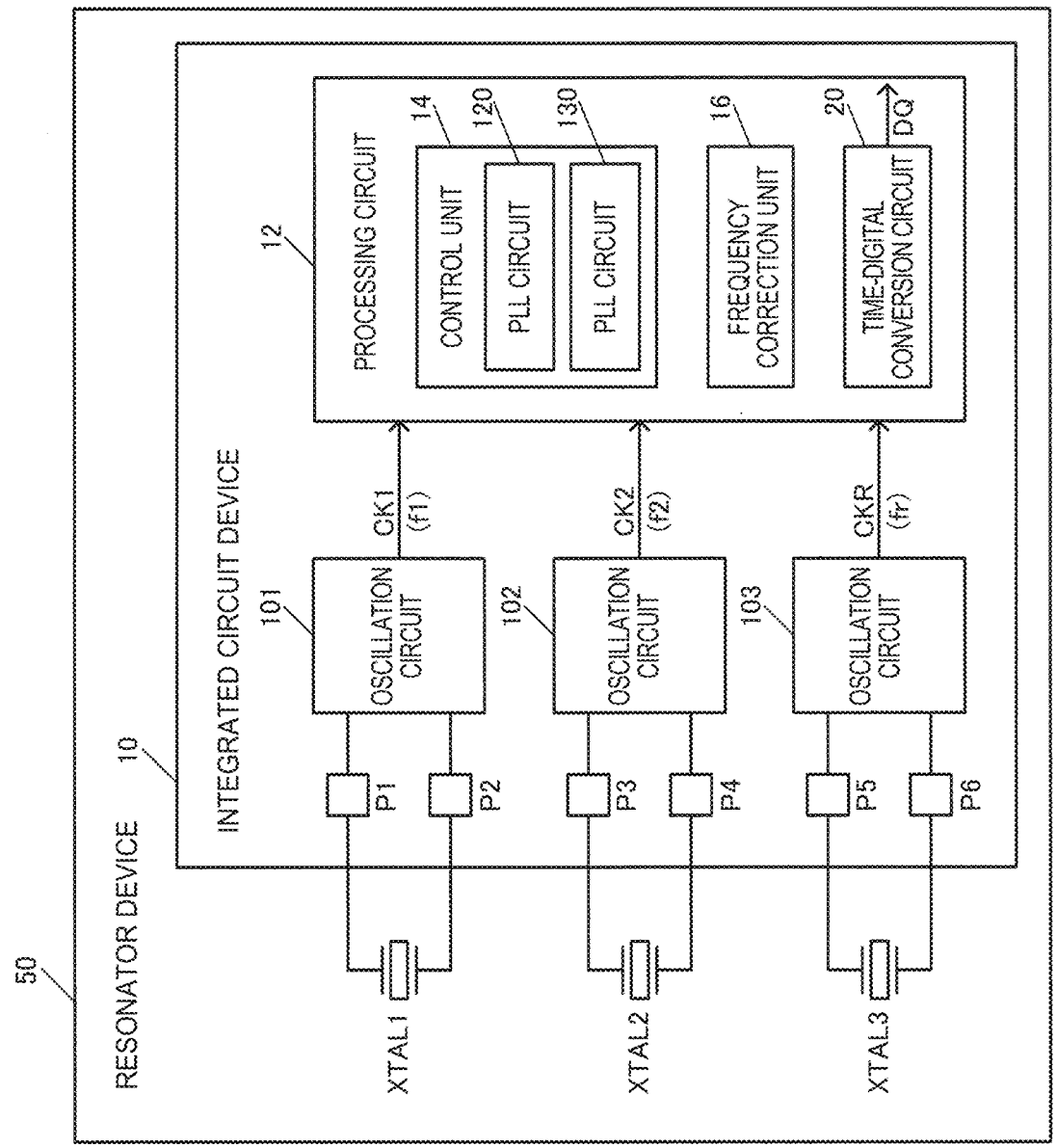
FIG. 3 illustrates a configuration example of an integrated circuit device and the resonator device in the embodiment.

FIG. 3 illustrates the configuration example of the integrated circuit device 10 and the resonator device 50 including the integrated circuit device 10 in the embodiment. The integrated circuit device 10 and the resonator device 50 are not limited to the configuration in FIG. 3. Various modifications including the following may be made. For example, some components (for example, resonator XTAL3, oscillation circuit 103, and processing circuit 12) of the integrated circuit device 10 and the resonator device 50 may be omitted, or other components may be added. The resonator device 50 includes the integrated circuit device 10 and the resonators XTAL1, XTAL2, and XTAL3. The integrated circuit device 10 includes oscillation circuits 101 and 102 (first and second oscillation circuits) that oscillate the resonators XTAL1 and XTAL2, terminals P1 and P2 (first and second terminals) connected to the oscillation circuit 101, and terminals P3 and P4 (third and fourth terminals) connected to the oscillation circuit 102. The integrated circuit device 10 may further include an oscillation circuit 103 (third oscillation circuit) that oscillates the resonator XTAL3, and terminals P5 and P6 (fifth and sixth terminals) connected to the oscillation circuit 103. The integrated circuit device 10 may include a processing circuit 12. A modification in which the resonator XTAL3 is not provided may be made. In this case, the configuration of the oscillation circuit 103 and the terminals P5 and P6 can be omitted.

Figure 13:
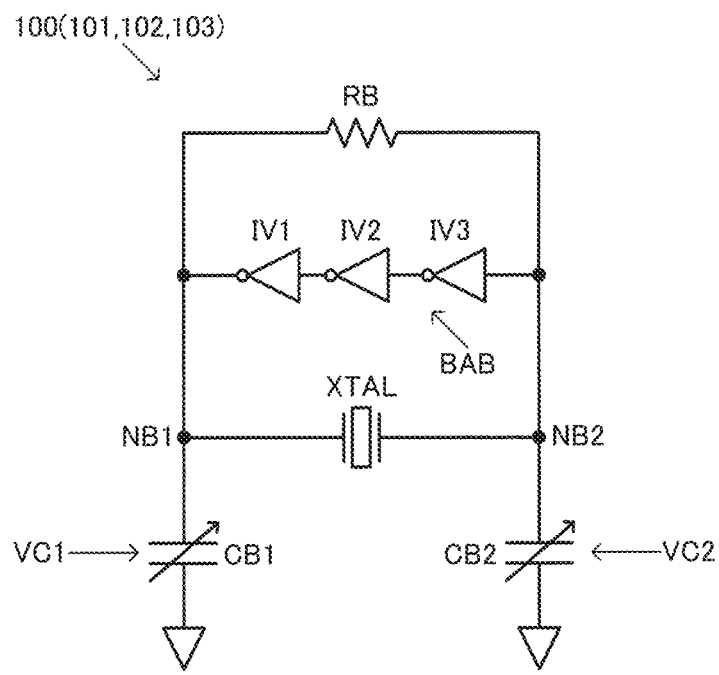
FIG. 13 illustrates a first configuration example of an oscillation circuit.
Figure 14:
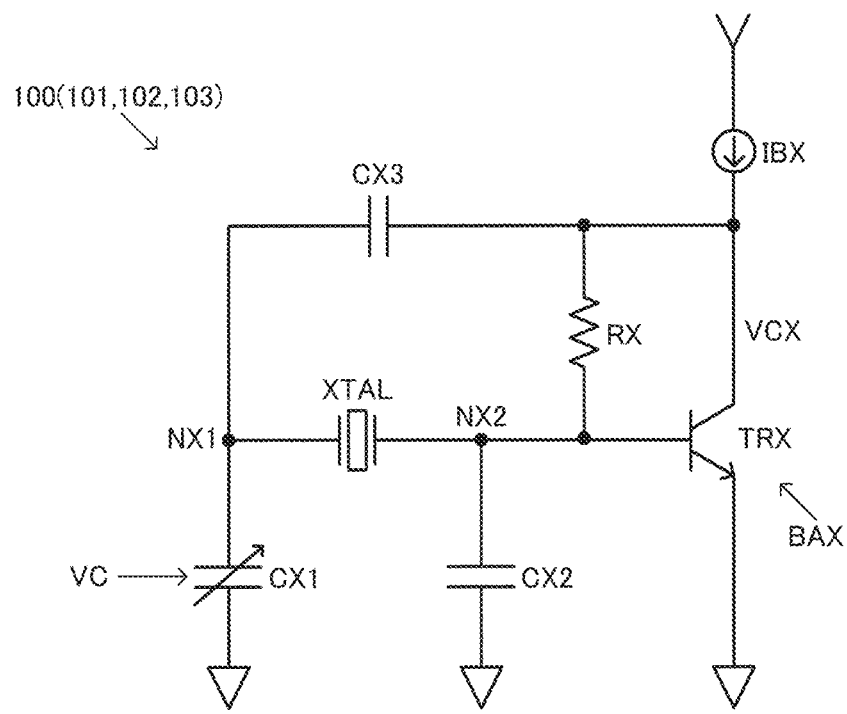
FIG. 14 illustrates a second configuration example of the oscillation circuit.

The terminals P1 to P6 are external terminals of the integrated circuit device 10 and are terminals referred to as pads, for example. The configuration and the like which will be described later and are illustrated in FIGS. 13 and 14 can be employed as circuit configurations of the oscillation circuits 101, 102, and 103. In this case, the terminal P1 is connected to one of an output side (drain side and collector side) and an input side (gate side and base side) of the oscillation circuit 101. The terminal P3 is connected to one of an output side (drain side and collector side) and an input side (gate side and base side) of the oscillation circuit 102. The terminal P5 is connected to one of an output side (drain side and collector side) and an input side (gate side and base side) of the oscillation circuit 103. The terminal P2 is connected to the other of the output side and the input side of the oscillation circuit 101. The terminal P4 is connected to the other of the output side and the input side of the oscillation circuit 102. The terminal P6 is connected to the other of the output side and the input side of the oscillation circuit 103.

The oscillation circuits 101 and 102 generate clock signals CK1 and CK2 (first and second clock signals) having clock frequencies f1 and f2 (first and second clock frequencies), by an oscillation operation using the resonators XTAL1 and XTAL2, respectively. The oscillation circuit 103 generates a clock signal CKR (third clock signal, reference clock signal) having a clock frequency fr (third clock frequency, reference clock frequency), by an oscillation operation using the resonator XTAL3. The clock frequencies f1, f2, and fr are frequencies which are different from each other, for example. The resonators XTAL1 to XTAL3 do not have a detection electrode. The oscillation circuits 101 to 103 are circuits that oscillate the resonators XTAL1 to XTAL3 without performing feedback control by a detection signal from the detection electrode. The processing circuit 12 performs processing based on the clock signals CK1 and CK2 generated by using the resonators XTAL1 and XTAL2.

Figure 4:
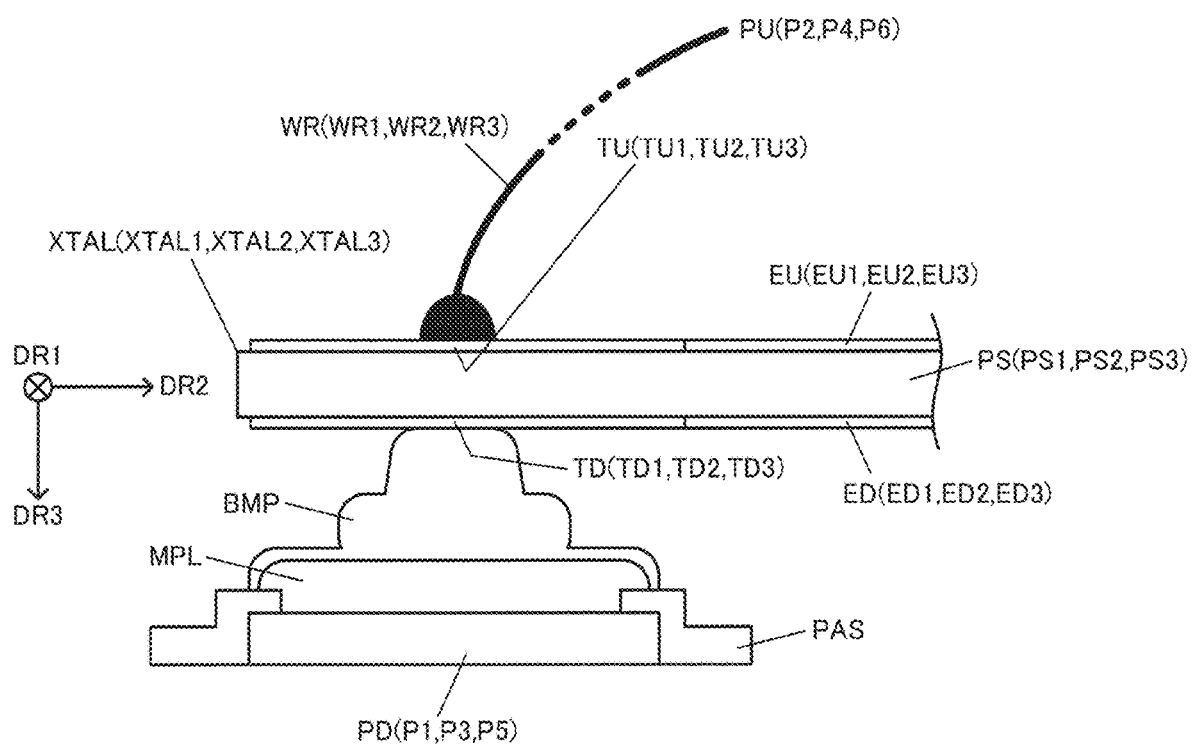
FIG. 4 is a sectional view illustrating a detailed example of bump connection.

In the resonator device 50 in the embodiment, as illustrated in FIG. 4 which will be described later, the terminal P1 of the integrated circuit device 10 is connected to the lower electrode ED1 of the resonator XTAL1 with a bump. The terminal P3 of the integrated circuit device 10 is connected to the lower electrode ED2 of the resonator XTAL2 with a bump. The terminal P5 of the integrated circuit device 10 is also connected to the lower electrode ED3 of the resonator XTAL3 with a bump. For example, the terminal P1 connected to the oscillation circuit 101 and the lower electrode ED1 of the resonator XTAL1 are electrically connected to each other by using a conductive bump (BMP in FIG. 4) such as a metal bump. The terminal P3 connected to the oscillation circuit 102 and the lower electrode ED2 of the resonator XTAL2 are electrically connected to each other by using a bump. The terminal P5 connected to the oscillation circuit 103 and the lower electrode ED3 of the resonator XTAL3 are electrically connected to each other by using a bump. The bump is a protruding connection electrode formed on the terminal. The bump connection is a method of connecting terminals via a bump which is a metal protrusion (conductive protrusion), with the terminals being opposed to each other. The bump connection has an advantage, for example, that the connection length can be reduced, in comparison to wire-bonding connection. The bump may be, for example, a resin core bump formed by plating a core of a bump, which is formed by resin, with metal.

In the embodiment, as illustrated in FIG. 1, in plan view (plan view when viewed from the top) in a direction (direction DR3) perpendicular (intersecting with) the substrate of the integrated circuit device 10, at least a portion of the resonator XTAL1 overlaps the oscillation circuit 101 and at least a portion of the resonator XTAL2 overlaps the oscillation circuit 102. For example, in FIG. 1, the resonator XTAL1 entirely overlaps the oscillation circuit 101, and the resonator XTAL2 entirely overlaps the oscillation circuit 102. In the plan view, the resonator XTAL3 overlaps a portion of the oscillation circuit 103. In this case, the oscillation circuits 101, 102, and 103 may include a power source circuit (regulator) that supplies power to the oscillation circuits and the like, in addition to circuit elements such as a buffer circuit, a resistor, and a capacitor which are illustrated in FIGS. 13 and 14 and will be described later.

FIG. 4 is a sectional view illustrating a detailed example of bump connection. As illustrated in FIG. 4, the terminal PD (P1, P3, and P5) of the integrated circuit device 10 is electrically connected to the lower electrode ED (ED1, ED2, and ED3) of the resonator XTAL (XTAL1, XTAL2, and XTAL3) via a bump BMP. Specifically, an opening (pad opening) for exposing the terminal PD is formed in a passivation film PAS of the integrated circuit device 10. A multi-plating layer MPL made of Ni/Pd/Au and the like is formed on the terminal PD and the bump BMP (Au bump) is formed on the plating layer MPL. It is possible to improve connection strength by forming the plating layer MPL between the terminal PD and the bump BMP in this manner. The bump BMP formed on the terminal PD is connected to the terminal electrode TD (TD1, TD2, and TD3) of the lower electrode ED in the resonator XTAL. One end of the bonding wire WR (WR1, WR2, and WR3) is connected to the terminal electrode TU (TU1, TU2, and TU3) of the upper electrode EU (EU1, EU2, and EU3) above the terminal electrode TD. The other end of the bonding wire WR is connected to the terminal PU (P2, P4, and P6) of the integrated circuit device 10. For example, as illustrated in FIGS. 1 and 2, the bonding wires WR1 and WR2 are connected to the terminals P2 and P4 of the oscillation circuits 101 and 102 in the integrated circuit device 10, respectively. The bonding wire WR3 is connected to the terminal P6 of the oscillation circuit 103. With this configuration, the terminals P1 and P2 of the oscillation circuit 101 in FIG. 3 can be respectively connected to the upper electrode EU1 (TU1) and the lower electrode ED1 (TD1) of the resonator XTAL1 and the terminals P3 and P4 of the oscillation circuit 102 can be respectively connected to the upper electrode EU2 (TU2) and the lower electrode ED2 (TD2) of the resonator XTAL2. The terminals P5 and P6 of the oscillation circuit 103 can be connected to the upper electrode EU3 (TU3) and the lower electrode ED3 (TD3) of the resonator XTAL3, respectively.

In the embodiment, as illustrated in FIG. 4, descriptions will be made on the assumption that XTAL1 to XTAL3 are described as XTAL, EU1 to EU3 are described as EU, ED1 to ED3 are described as ED, TU1 to TU3 are described as TU, TD1 to TD3 are described as TD, WR1 to WR3 are described as WR, P1, P3, and P5 are described as PD, P2, P4, and P6 are described as PU, and the oscillation circuits 101 to 103 are described as the oscillation circuit 100.

Figure 5:
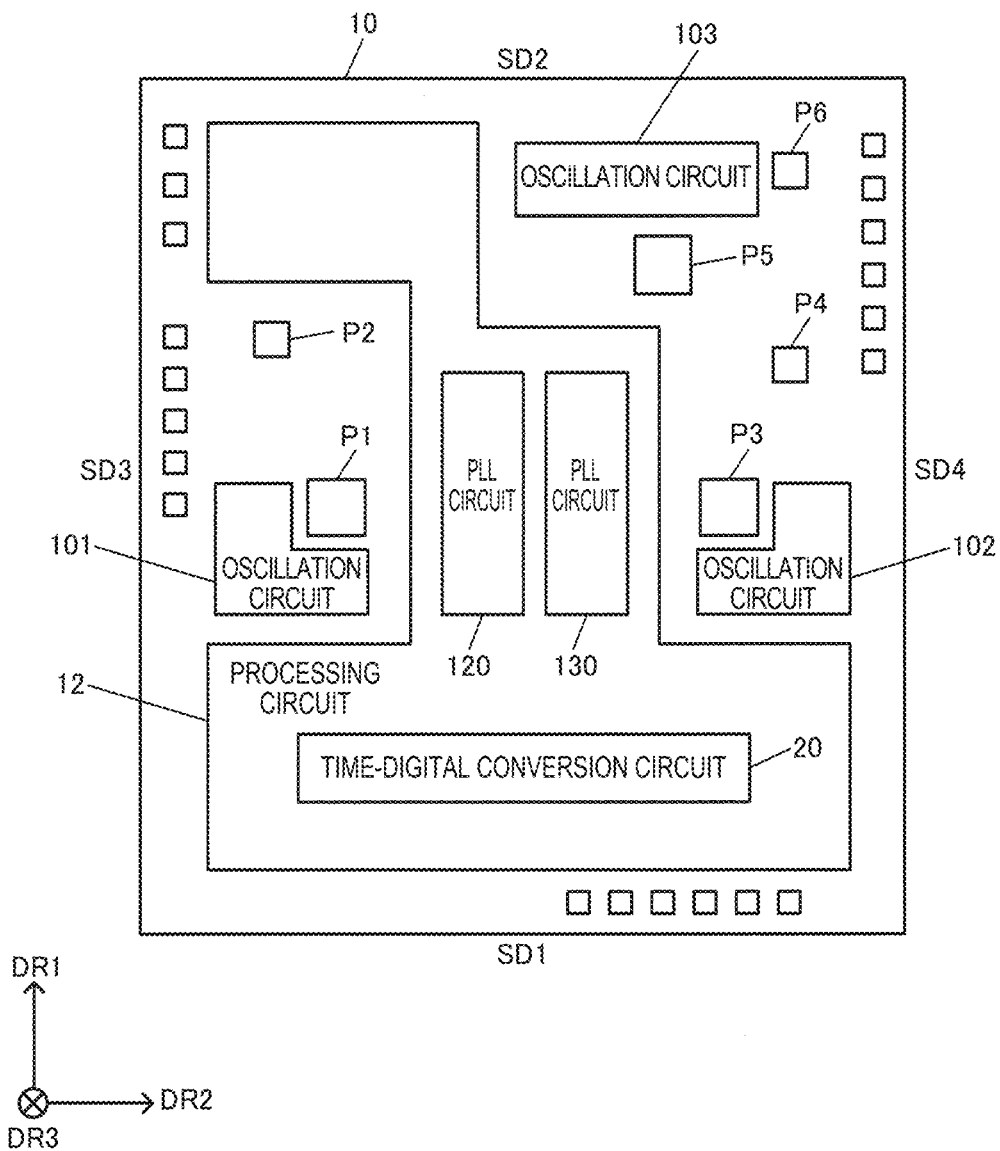
FIG. 5 illustrates a layout example of the integrated circuit device.

FIG. 5 is a diagram illustrating a layout example of the integrated circuit device 10. In FIG. 5, a direction from a side SD1 (first side) of the integrated circuit device 10 toward the opposing side SD2 (second side) thereof is set as DR1, a direction from a side SD3 (third side) thereof intersecting with (perpendicular to) the sides SD1 and SD2 toward the opposing side SD4 (fourth side) thereof is set as DR2. The processing circuit 12 includes PLL circuits 120 and 130 as a controller (synchronization circuit) 14 in FIG. 3, and a time-digital conversion circuit 20. Thus, a circuit configuration in FIG. 11, which will be described later can be realized. The time-digital conversion circuit 20 is provided on the direction DR1 side of the side SD1. The PLL circuits 120 and 130 are provided on the direction DR1 side of the time-digital conversion circuit 20. The oscillation circuit 101 is provided between the side SD3 and the PLL circuits 120 and 130. The oscillation circuit 102 is provided between the side SD4 and the PLL circuits 120 and 130. The oscillation circuit 103 is provided on the direction DR1 side of the PLL circuits 120 and 130. The terminals P1 and P2 are provided at places corresponding to the oscillation circuit 101 (in the vicinity of the oscillation circuit 101). The terminals P3 and P4 are provided at places corresponding to the oscillation circuit 102. The terminals P5 and P6 are provided at places corresponding to the oscillation circuit 103. Each of the terminals P1, P3, and P5 on which bump connection is performed has an area larger than that of each of the terminals P2, P4, and P6 on which wire-bonding connection is performed. The area of each of the terminals P1, P3, and P5 is about twice the area of each of the terminals P2, P4, and P6. As described above, connection strength of the bump connection is improved, or parasitic resistance is reduced, by setting the areas of the terminals P1, P3, and P5 to be large. It is possible to realize appropriate single point support and the like of the resonator by using a portion on which bump connection is performed, as the support portion.

According to the above-described resonator device 50 in the embodiment, the lower electrodes ED1 to ED3 of the resonator XTAL1 to XTAL3 may be mounted on the terminals P1 to P3 of the integrated circuit device 10 in a manner of bump connection. Thus, as illustrated in FIGS. 1 and 2, a plurality of resonators XTAL1 to XTAL3 can be mounted immediately above the integrated circuit device 10 and it is possible to realize a small resonator device 50 which is capable of compactly accommodating the plurality of resonators XTAL1 to XTAL3 and the integrated circuit device 10 in the package 52. Here, being mounted immediately above the device means that the resonators XTAL1 to XTAL3 are mounted directly over the integrated circuit device 10 without interposing a member or an element between the integrated circuit device 10 and the resonators XTAL1 to XTAL3, for example. For example, in a side view (direction DR1), the integrated circuit device 10 and the resonators XTAL1 to XTAL3 are disposed such that the integrated circuit device 10 is parallel (substantially parallel) to the resonators XTAL1 to XTAL3 and the main surface of the integrated circuit device 10 faces the main surfaces of the resonators XTAL1 to XTAL3. A distance between the main surface of the integrated circuit device 10 and the main surfaces of the resonators XTAL1 to XTAL3 is short and corresponds to the height of the bump BMP.

As noted above, in the related art, it is difficult to realize a small resonator device in which a plurality of resonators are mounted, due to the area or wiring of a mounting portion of a package. On the contrary, in the embodiment, the plurality of resonators XTAL1 to XTAL3 can be disposed immediately above the integrated circuit device 10 by using the portions at which bump connection is performed, as the support portions. For example, as illustrated in FIG. 1, the plurality of resonators XTAL1 to XTAL3 may be mounted so as to overlap the integrated circuit device 10 in plan view. Thus, the integrated circuit device 10 and the resonator XTAL to XTAL3 can be mounted by effectively utilizing the limited accommodation space S of the package 52, and thus it is possible to realize a resonator device 50 obtained by compactly accommodating the resonator XTAL to XTAL3 in one package 52.

In the embodiment, as illustrated in FIG. 1, the oscillation circuits 101 to 103 of the integrated circuit device 10 and the resonators XTAL1 to XTAL3 are disposed to respectively overlap each other in plan view. Thus, it is possible to connect the oscillation circuits 101 to 103 and the resonators XTAL1 to XTAL3 with a short connection path, and thus to reduce extra parasitic resistance or parasitic capacitance in the connection path. Accordingly, it is possible to prevent degradation of performance occurring due to the parasitic resistance or the parasitic capacitance and to realize a high-accurate oscillator and the like.

In the embodiment, at least one the terminal P2 of the integrated circuit device 10 and the upper electrode EU1 of the resonator XTAL1, or the terminal P4 of the integrated circuit device 10 and the upper electrode EU2 of the resonator XTAL2 is connected by a bonding wire. For example, in FIGS. 1 and 2, the terminal P2 of the integrated circuit device 10 is connected to the upper electrode EU1 of the resonator XTAL1 by the bonding wire WR1. The terminal P4 of the integrated circuit device 10 is connected to the upper electrode EU2 of the resonator XTAL2 by the bonding wire WR2. The terminal P6 of the integrated circuit device 10 is connected to the upper electrode EU3 of the resonator XTAL3 by the bonding wire WR3.

As described above, in the embodiment, bump connection is performed between the terminal PD (P1, P3, and P5) of the integrated circuit device 10 and the lower electrode ED (ED1 to ED3) of the resonator XTAL (XTAL1 to XTAL3) and wire-bonding connection is performed between the terminal PU (P2, P4, and P6) and the upper electrode EU (EU1 to EU3). According to this configuration, it is possible to realize thickness shear resonance and the like of the resonator XTAL in a manner that the oscillation circuit 100 (101 to 103) is connected between the terminals PD and PU of the integrated circuit device 10 and a voltage is applied between the lower electrode ED and the upper electrode EU of the resonator XTAL. Since the oscillation circuit 100 and the resonator XTAL are disposed to overlap each other in plan view, it is possible to reduce the length of the bonding wire WR (WR1 to WR3) and to reduce unnecessary parasitic resistance or parasitic capacitance.

In the embodiment, as illustrated in FIGS. 1 and 2, the terminal P2 of the integrated circuit device 10 is connected to the terminal electrode TU1 of the upper electrode EU1 in the resonator XTAL1 by the bonding wire WR1. The terminal electrode TU1 of the upper electrode EU1 and the terminal electrode TD1 of the lower electrode ED1 in the resonator XTAL1 overlap the terminal P1 of the integrated circuit device 10 in plan view (overlap at least a portion of the terminal P1 of the integrated circuit device 10). That is, as illustrated in FIG. 4, wire-bonding connection is performed just above the place (position of BMP) in which bump connection is performed. According to this configuration, the resonator XTAL1 can be mounted immediately above the integrated circuit device 10 and is supported at a single point in the place in which bump connection is performed. For example, the resonator XTAL1 may be resonated by using the place at which bump connection is performed, as a fixed end. For example, if the resonator XTAL1 is supported at two points, thermal stress caused by, for example, a difference of a thermal expansion coefficient between the resonator XTAL1 and the integrated circuit device 10 may be applied and thus characteristics of the resonator XTAL1 or the integrated circuit device 10 may be affected. At this point, as illustrated in FIG. 4, if the resonator XTAL1 is mounted and supported at a single point in the place at which bump connection is performed, it is possible to suppress an occurrence of such thermal stress and to reduce degradation of the characteristics and the like occurring due to the thermal stress.

In the embodiment, the terminal P4 of the integrated circuit device 10 is connected to the terminal electrode TU2 of the resonator XTAL2 by the bonding wire WR2. The terminal electrodes TU2 and TD2 overlap the terminal P3 of the integrated circuit device 10 in plan view. Similarly, the terminal P6 of the integrated circuit device 10 is connected to the terminal electrode TU3 of the resonator XTAL3 by the bonding wire WR3. The terminal electrodes TU3 and TD3 overlap the terminal P5 of the integrated circuit device 10 in plan view. According to this configuration, the resonators XTAL2 and XTAL3 can also be mounted immediately above the integrated circuit device 10 and supported at a single point in the place at which bump connection is performed. Thus, it is possible to reduce degradation of the characteristics and the like occurring due to thermal stress, in comparison to a case where two-point support is performed.

The descriptions of a case where one terminal PD of the integrated circuit device 10 is connected to the lower electrode ED of the resonator XTAL with the bump and the other terminal PU is connected to the upper electrode EU by the bonding wire WR is made above. However, the embodiment is not limited thereto. For example, both the terminals PD and PU of the integrated circuit device 10 may be connected to the lower electrode ED of the resonator XTAL with a bump. Specifically, bump connection is performed in at least one of a case of the terminal P2 of the integrated circuit device 10 and the lower electrode ED1 of the resonator XTAL1 and a case of the terminal P4 and the lower electrode ED2 of the resonator XTAL2. Alternatively, the terminal P6 is connected to the lower electrode ED3 of the resonator XTAL3 with the bump. According to this configuration, the resonator XTAL can be mounted in two places at which the bump connection of the terminals PD and PU of the integrated circuit device 10 is performed, while being supported at two points. Thus, it is possible to omit the step of wire-bonding connection and to prevent degradation of the performance occurring due to parasitic resistance or parasitic capacitance of the bonding wire.

In a case where bump connection is performed at both the terminals PD and PU, it is desirable to reduce the distance between the terminals PD and PU and to reduce the negative influence of thermal stress occurring by being supported at two points which are the bump connection places of the terminals PD and PU. For example, the distance between the terminals PD and PU is very short by disposing the terminals PD and PU in the vicinity of the oscillation circuit 100.

The resonator device 50 in the embodiment includes the resonator XTAL3 in addition to the resonators XTAL1 and XTAL2, and the integrated circuit device 10 includes the terminals P5 and P6 and the oscillation circuit 103 that oscillate the resonator XTAL3. The terminal P5 of the integrated circuit device 10 is connected to the lower electrode ED3 of the resonator XTAL3 with the bump. Thus, the three resonators XTAL1 to XTAL3 can be mounted over the integrated circuit device 10 and are supported at places at which bump connection is performed. In this case, as illustrated in FIG. 1, the resonators XTAL1 and XTAL2 are disposed so that the longitudinally extended direction of each extends along the direction DR1 in plan view. That is, the resonators XTAL1 and XTAL2 are mounted over the integrated circuit device 10 so that each is elongated along the direction DR1. The resonator XTAL3 is disposed so that the longitudinally extended direction thereof extends along the direction DR2 intersecting with (perpendicular to) the direction DR1 in plan view. That is, the resonator XTAL3 is mounted over the integrated circuit device 10 so that it is elongated along the direction DR2. For example, in FIG. 1, the resonators XTAL1 and XTAL2 are disposed to cause a vertical direction of the page to be along the longitudinally elongated direction, and the resonator XTAL3 is disposed to cause a horizontal direction of the page to be along the longitudinally elongated direction. According to this configuration, the three resonators XTAL1 to XTAL3 can be efficiently mounted on the rectangular integrated circuit device 10. Thus, it is possible to realize a resonator device 50 in which three resonators XTAL1 to XTAL3 are efficiently accommodated in the small package 52. Since the three resonators XTAL1 to XTAL3 are provided in the resonator device 50, it is possible to realize various kinds of processing using three clock signals generated by the three resonators XTAL1 to XTAL3.

In the embodiment, as illustrated in FIGS. 1 and 2, the terminal P2 of the integrated circuit device 10 and the terminal electrode TU1 of the upper electrode EU1 in the resonator XTAL1, which is connected to the terminal P2 are disposed with a side SDA interposed between the terminal P2 and the terminal electrode TU1 in plan view. The side SDA is a side which is the closest to the terminal P2 among all sides of the resonator XTAL1. In plan view, the terminal P4 and the terminal electrode TU2 of the resonator XTAL2, which is connected to the terminal P4 are disposed with a side SDB interposed between the terminal P4 and the terminal electrode TU2. The side SDB is a side which is the closest to the terminal P4 among all sides of the resonator XTAL2. Similarly, the terminal P6 and the terminal electrode TU3 of the resonator XTAL3 are disposed with a side SDC interposed between the terminal P6 and the terminal electrode TU3 in plan view. The side SDC is aside which is the closest to the terminal P6 among all sides of the resonator XTAL3.

As described above, if the terminal P2 and the terminal electrode TU1 are disposed with the closest side SDA interposed therebetween, the terminal P4 and the terminal electrode TU2 are disposed with the closest side SDB interposed therebetween, and the terminal P6 and the terminal electrode TU3 are disposed with the closest SDC interposed therebetween, it is possible to reduce the lengths of the bonding wires WR1, WR2, and WR3. Thus, it is possible to suppress degradation of oscillation characteristics and the like occurring due to parasitic resistance or parasitic capacitance of the bonding wires WR1, WR2, and WR3.

The integrated circuit device (semiconductor chip) 10 may include a plurality of metal layers. A reference voltage which is a power supply voltage, or a ground voltage may be applied to at least a portion of a portion of the top layer (closest layer to the resonators XTAL1 to XTAL3), which overlaps the resonators XTAL1 to XTAL3 in plan view. Alternatively, a configuration in which the reference voltage which is the power supply voltage, or the ground voltage is applied to the top layer (metal layer) except for a portion thereof, which is used as the terminal may be made. Thus, it is possible to use the top layer as a shield layer and to reduce interference between the integrated circuit device 10 and the resonators XTAL1 to XTAL3. Accordingly, it is possible to stabilize an operation state of the integrated circuit device 10 or oscillation states of the resonators XTAL1 to XTAL3.

2. Integrated Circuit Device

Next, details of the integrated circuit device 10 will be described. As illustrated in FIG. 3, the integrated circuit device 10 includes the oscillation circuits 101 and 102 and the processing circuit 12. The processing circuit 12 performs processing based on the clock signals CK1 and CK2 generated by the oscillation circuits 101 and 102 oscillating the resonators XTAL1 and XTAL2. The integrated circuit device 10 includes the oscillation circuit 103, and the processing circuit 12 performs processing based on the clock signal CKR (reference clock signal) generated by the oscillation circuit 103 oscillating the resonator XTAL3. Specifically, the processing circuit 12 performs processing using the frequency difference information or the frequency comparison information between the clock signals CK1 and CK2.

According to this configuration, it is possible to realize various kinds of processing using the clock signals CK1, CK2, and CKR while realizing the resonator device 50 in which the plurality of resonators XTAL1 to XTAL3 are compactly accommodated in the package 52. According to the disposition method in the embodiment, it is possible to reduce parasitic resistance or parasitic capacitance in the terminals or the wirings of the oscillation circuits 101 to 103. Thus, it is possible to realize improvement of precision of the clock signal and to realize improvement of processing performance and the like in the processing circuit 12.

The processing circuit 12 includes the controller 14 (synchronization circuit) that controls at least one of an oscillation frequency and a phase of the oscillation signal from at least one of the oscillation circuits 101 and 102. For example, in the related art disclosed in JP-A-5-87954, first and second crystal oscillators operate in a manner of free run without any control. On the contrary, in FIG. 3, the controller 14 controls an operation or the setting of at least one of the oscillation circuits 101 and 102. For example, the controller controls a circuit operation such as an oscillation operation of the at least one oscillation circuit or controls setting of a circuit constant such as the oscillation frequency and the phase. Thus, it is possible to set a frequency relationship or a phase relationship between the clock signals CK1 and CK2 to be appropriate for processing such as time-digital conversion by control of the controller 14, and thus to realize improvement of the processing performance of the processing circuit 12 or simplification of the processing thereof.

Figure 6:
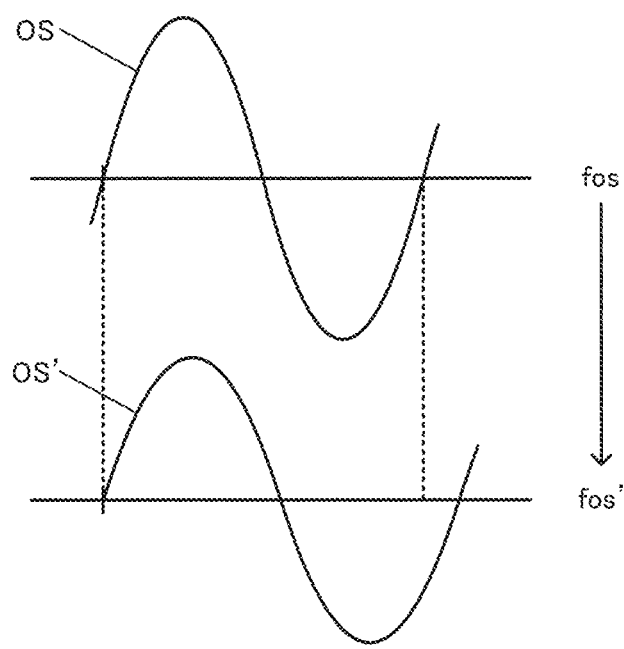
FIG. 6 is a diagram illustrating control of an oscillation frequency of an oscillation signal.

Specifically, in FIG. 6, the controller 14 performs control of changing an oscillation frequency of an oscillation signal OS of at least one of the oscillation circuits 101 and 102 from fos to fos'. For example, the controller 14 performs control of changing the oscillation frequency so as to cause the clock signals CK1 and CK2 to have a given frequency relationship. As an example, the controller 14 controls the oscillation frequency of at least one oscillation circuit such that phase synchronization is performed between the clock signals CK1 and CK2 at a phase synchronization timing.

Figure 7:
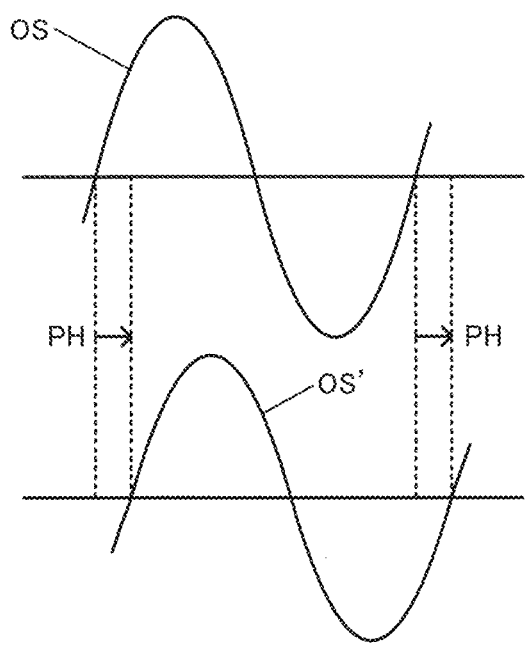
FIG. 7 is a diagram illustrating control of a phase of the oscillation signal.

In FIG. 7, the controller 14 performs control of changing the phase of the oscillation signal OS of at least one oscillation circuit, as indicated by PH. For example, the controller 14 performs control of changing the phase so as to cause the clock signals CK1 and CK2 to have a given phase relationship. As an example, the controller 14 controls the phase of at least one oscillation circuit such that phase synchronization is performed between the clock signals CK1 and CK2 at the phase synchronization timing.

As described above, if the controller 14 controls the oscillation frequency or the phase of the oscillation signal, it is possible to set, for example, the frequency relationship or the phase relationship between the clock signals CK1 and CK2 to be appropriate for processing of the processing circuit 12 such as time-digital conversion. Thus, it is possible to realize processing of the processing circuit 12 using the clock signals CK1 and CK2 which are set to have the appropriate frequency relationship or phase relationship. Accordingly, for example, the processing performance is improved, or the processing is simplified.

The controller 14 controls at least one of the oscillation circuits 101 and 102 so as to cause the clock signals CK1 and CK2 to have a given frequency relationship or a given phase relationship. For example, the controller 14 controls at least one oscillation circuit so as to cause the clock signals CK1 and CK2 to have a frequency relationship or a phase relationship which is appropriate for processing of the processing circuit 12 such as time-digital conversion. For example, the controller 14 controls at least one oscillation circuit so as to cause the frequency difference or the phase difference between the clock signals CK1 and CK2 to have a predetermined frequency difference or phase difference. Alternatively, the controller 14 controls at least one oscillation circuit such that phase synchronization is performed between the clock signals CK1 and CK2 at the phase synchronization timing. For example, the controller 14 controls at least one oscillation circuit so as to cause transition timings of the clock signals CK1 and CK2 to coincide (substantially coincide) with each other at the phase synchronization timing.

The frequency relationship between the clock signals CK1 and CK2 means a relationship of a frequency difference between the clock frequencies f1 and f2, a relationship of a frequency ratio, a predetermined relational expression represented by the clock frequency, a frequency magnitude relationship, and the like. The phase relationship between the clock signals CK1 and CK2 means a relationship of a phase difference between the clock signals CK1 and CK2, a back-and-forth relationship of a phase, and the like. For example, the controller 14 controls at least one of the oscillation circuits 101 and 102 such that the frequency relationship (frequency difference, magnitude relationship, frequency ratio, and the like) or the phase relationship (phase difference, back-and-forth relationship of a phase, and the like) between the clock signals CK1 and CK2 is maintained to have a given relationship even in a case where manufacturing variation or environmental fluctuation such as temperature fluctuation occurs. With this configuration, it is possible to realize processing such as time-digital conversion, in a state where the frequency relationship or the phase relationship between the clock signals CK1 and CK2 is appropriate. Thus, for example, the processing performance is improved, or the processing is simplified.

Specifically, the controller 14 controls at least one of the oscillation circuits 101 and 102 to satisfy N/f1=M/f2 (N and M are integers of 2 or greater, which are different from each other) in a case where the clock frequencies of the clock signals CK1 and CK2 are respectively set as f1 and f2. According to this configuration, the processing circuit 12 can realize processing such as time-digital conversion, in a state where the clock signals CK1 and CK2 are set to have an appropriate frequency relationship.

The processing circuit 12 includes the time-digital conversion circuit 20 that converts a time into a digital value DQ based on the clock signals CK1 and CK2. The time-digital conversion circuit 20 converts a time difference in transition timing between a signal STA (first signal and, for example, start signal) and a signal STP (second signal and, for example, stop signal) into a digital value DQ by using the clock signals CK1 and CK2. The time difference in transition timing between the signals STA and STP is a time difference between edges of the signals STA and STP (for example, between rising edges thereof or between falling edges thereof). In the embodiment, time-digital conversion of converting a time difference in transition timing between the signals STA and STP (first and second signals) into a digital value will be mainly described. However, it is not limited thereto. For example, time-digital conversion for measuring an absolute time point and the like may be provided.

The processing circuit 12 includes a frequency corrector 16 that performs frequency correction processing based on the frequency difference information or the frequency comparison information between the clock signals CK1 and CK2. For example, the frequency corrector 16 realizes a highly-accurate oscillator in a manner that compensation processing of temperature characteristics at an oscillation frequency is performed by using the frequency difference information or the frequency comparison information between the clock frequencies f1 and f2 of the clock signals CK1 and CK2 generated by the resonators XTAL1 and XTAL2. For example, it is assumed that an oscillation frequency of the resonator XTAL1 has first temperature characteristics and an oscillation frequency of the resonator XTAL2 has second temperature characteristics different from the first temperature characteristics. In this case, the processing circuit 12 performs correction processing of the temperature characteristics at the oscillation frequency by using the first temperature characteristics and the second temperature characteristics. Here, the frequency difference information indicates a frequency difference ($\Delta f = |f1 - f2|$) between the clock frequencies f1 and f2. The frequency difference information may be the frequency difference $\Delta f$ itself or be information equivalent to the frequency difference $\Delta f$. The frequency comparison information is obtained by comparison between the clock frequencies f1 and f2. For example, the frequency comparison information may be result information of comparison processing between the clock frequencies f1 and f2 or be information indicating a frequency ratio between the clock frequencies f1 and f2.

For example, a difference between the resonance frequencies of the resonators XTAL1 and XTAL2 occurs by a difference in temperature dependency between the resonance frequencies of both the resonators XTAL1 and XTAL2. Thus, measurement of the frequency difference $\Delta f$ is equivalent to measurement of the temperatures of the resonators and thus it is possible to realize compensation processing of the temperature characteristics at the oscillation frequency. For example, in a case where the frequency difference $\Delta f$ is changed by changing the temperature, the frequency difference $\Delta f$ is measured within a predetermined temperature range. A relationship between the measured frequency difference $\Delta f$ and a correction frequency difference (cf=ft-f1) is stored in a storage unit (ROM) of the integrated circuit device 10 for each predetermined value in the frequency difference $\Delta f$. ft indicates an aimed output frequency. The frequency difference $\Delta f$ is set to have a very small value. Thus, when the integrated circuit device 10 operates, the frequency difference $\Delta f$ is obtained, the correction frequency difference cf corresponding to the obtained frequency difference $\Delta f$ is read from the storage unit, and the correction frequency difference cf is added to the clock frequency of one resonator. In this manner, the output frequency ft at which the temperature has been compensated can be obtained. The compensation processing of the temperature characteristics at the oscillation frequency may be performed based on not such frequency difference information but frequency comparison information obtained by comparison processing between the clock frequencies f1 and f2.

As the processing performed by the processing circuit 12 using the clock signals CK1 and CK2 and the like, various kinds of processing can be assumed. For example, as will be described later, time-digital conversion in which the frequency difference (cycle difference) between the clock frequencies f1 and f2 is used as resolution may be performed. Processing by redundantly having two resonators may be performed. For example, in a case where abnormality occurring in one resonator is detected, fault detection may be performed by switching the one resonator to the other resonator or by monitoring clock frequencies of the two resonators. In this case, it is possible to realize determination processing for switching of a resonator or for fault detection by performing comparison processing between the clock frequencies f1 and f2. Alternatively, it is possible to realize a high frequency band of a programmable oscillator by providing resonators having two or more different frequencies in the resonator device 50. In addition, a highly-accurate oscillator may be realized by taking multiple data of clock frequencies of two resonators or more and averaging the clock frequencies.

3. Time-Digital Conversion

Figure 8:
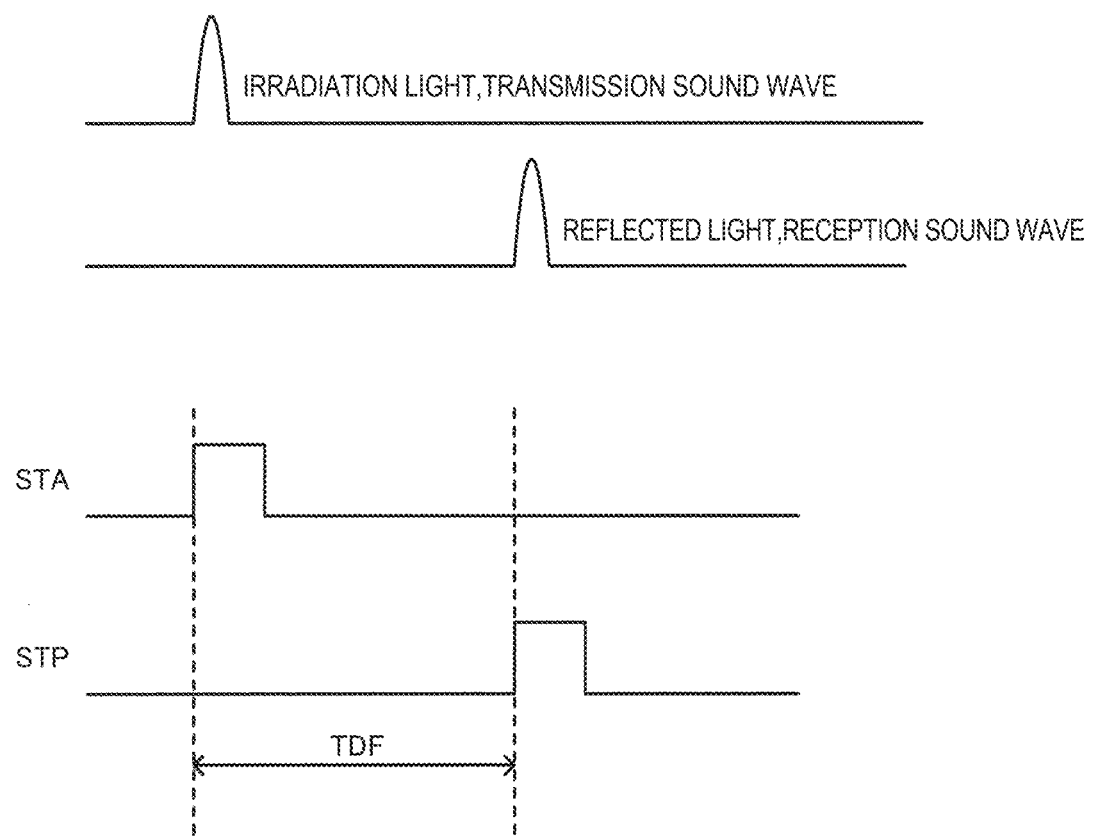
FIG. 8 is a diagram illustrating an example of measuring a physical quantity by using signals.

Next, a detailed example of time-digital conversion will be described. FIG. 8 is a diagram illustrating a relationship between the signal STA (start signal) and the signal STP (stop signal). The time-digital conversion circuit 20 converts a time difference TDF in transition timing between the signals STA and STP into a digital value DQ. In FIG. 8, TDF indicates a time difference between transition timings when the signals STA and STP rise (between rising edges). However, TDF may indicate a time difference between transition timings when the signals STA and STP fall (between falling edges). The resonator device 50 in the embodiment can be used in a physical quantity measurement device in addition to the oscillator. In this case, the resonator device 50 as the physical quantity measurement device emits irradiation light (for example, laser light) to a target (for example, object around a car) by using the signal STA as illustrated in FIG. 8. The signal STP is generated by receiving reflected light from the target. For example, the signal STP is generated by shaping the waveform of a received light signal. According to this configuration, it is possible to measure a distance from the target as the physical quantity, for example, in a manner of time of flight (TOF), by converting a time difference TDF in transition timing between the signals STA and STP into a digital value DQ. Thus, it is possible to use the measured distance for automated driving of cars and motion control of robots, for example.

Alternatively, the resonator device 50 as the physical quantity measurement device transmits a transmission sound wave (for example, ultrasonic wave) to a target (for example, living body) by using the signal STA. The signal STP is generated by receiving a reception sound wave from the target. For example, the signal STP is generated by shaping the waveform of the reception sound wave. According to this configuration, it is possible to measure a distance from the target and the like and to, for example, measure biological information by the ultrasonic wave, by converting a time difference TDF into a digital value DQ.

In FIG. 8, transmission data may be transmitted by the signal STA. A time from when the transmission data is transmitted until reception data is received may be measured by the signal STP generated by transmitting the transmission data and receiving the reception data. The physical quantity measured in the embodiment is not limited to the time and the distance. Various kinds of physical quantities such as a flow quantity, a flow rate, a frequency, a velocity, acceleration, an angular velocity, and angular acceleration are considered.

Figure 9:
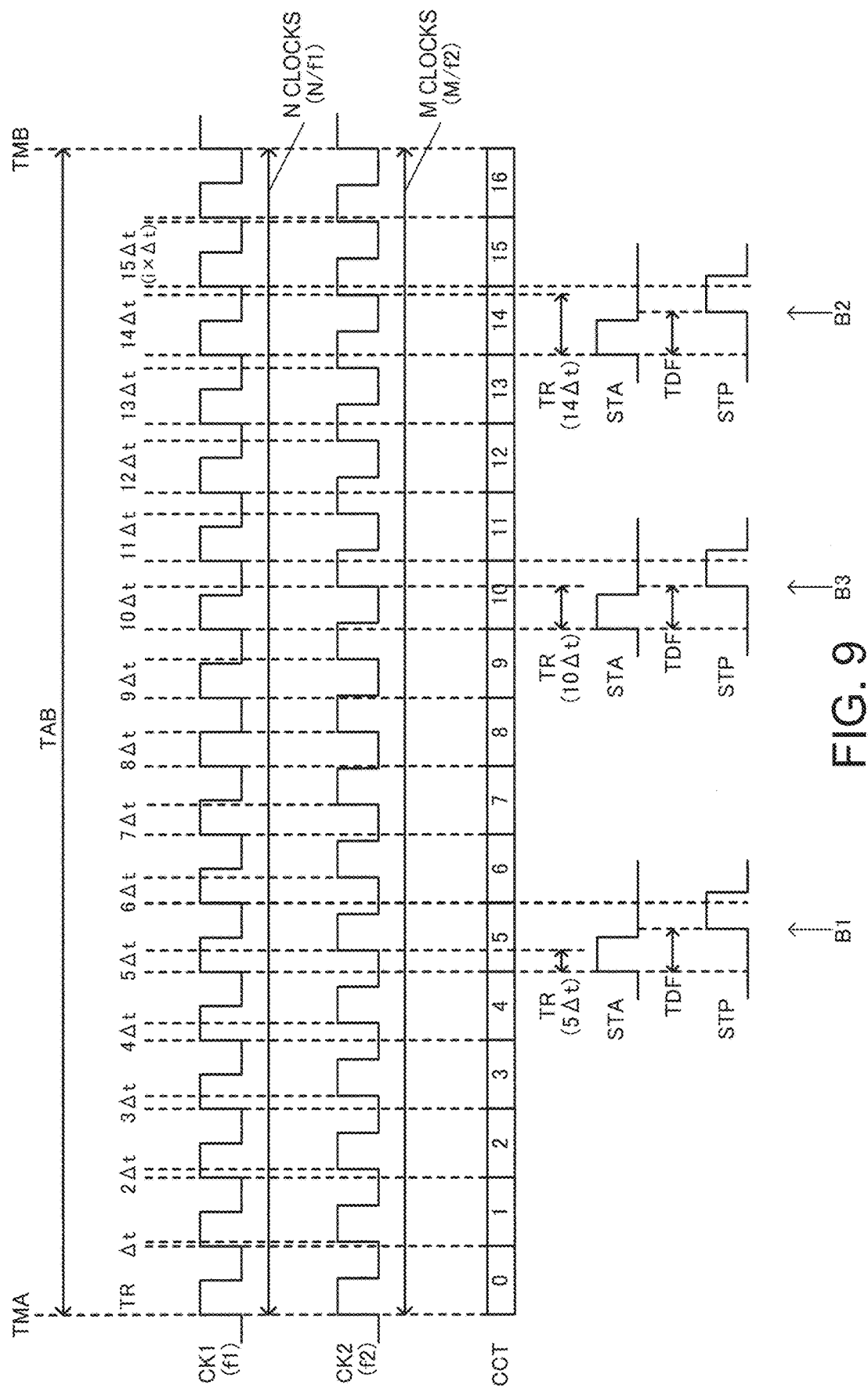
FIG. 9 is a signal waveform diagram illustrating an example of time-digital conversion.

FIG. 9 is a signal waveform diagram illustrating a time-digital conversion method in the embodiment. Phase synchronization between clock signals CK1 and CK2 is performed at a phase synchronization timing TMA and transition timings of the clock signals CK1 and CK2 coincide with each other. Then, the time difference TR (phase difference) between clocks of the clock signals CK1 and CK2 is increased for each clock cycle (CCT) by Δt so as to come to Δt, 2Δt, 3Δt, . . . . For example, phase synchronization between the clock signals CK1 and CK2 is performed at the next phase synchronization timing TMB and transition timings of the clock signals CK1 and CK2 coincide with each other.

In the embodiment, a time is converted into a digital value by using a plurality of resonators XTAL1 and XTAL2 and using the clock frequency difference therebetween. That is, the time-digital conversion circuit 20 converts a time into a digital value at resolution corresponding to the frequency difference (|f1−f2|) between the clock frequencies f1 and f2. The time-digital conversion circuit converts the time into the digital value by using the principle of a Vernier caliper, for example. According to this configuration, resolution of time-digital conversion can be set by using the frequency difference (|f1−f2|), and thus it is possible to, for example, improve performance of time-digital conversion, such as accuracy or resolution. Specifically, the resolution (time resolution) in time-digital conversion can be represented by Δt=|1/f1−1/f2|=|f1−f2|/(f1×f2). Thus, the time-digital conversion circuit 20 converts a time into a digital value at resolution Δt satisfying Δt=|1/f1−1/f2|=|f1−f2|/(f1×f2). The resolution is represented by Δt=|f1−f2|/(f1×f2) and corresponds to the frequency difference (|f1−f2|).

According to this configuration, the resolution in time-digital conversion can be set by setting the clock frequencies f1 and f2. For example, it is possible to reduce the resolution Δt by reducing the frequency difference (|f1−f2|), and to realize time-digital conversion having high resolution. It is possible to reduce the resolution Δt by setting the clock frequencies f1 and f2 to be high frequencies, and to realize time-digital conversion having high resolution. If the clock signals CK1 and CK2 are generated by the resonators XTAL1 and XTAL2, accuracy of time-digital conversion is also improved in comparison to a case using a delay element of a semiconductor element. In particular, in the embodiment, since crystal resonators are used as the resonators XTAL1 and XTAL2, it is possible to suppress fluctuation in the clock frequencies f1 and f2 occurring by manufacturing variation or environmental fluctuation such as temperature fluctuation, to the minimum. Thus, it is possible to also suppress fluctuation of the resolution Δt=|f1−f2|/(f1×f2) to the minimum and to realize further improvement of the performance of time-digital conversion.

As illustrated in FIG. 9, the length of a period TAB between the phase synchronization timings TMA and TMB corresponds to N clocks of the clock signal CK1. The length of the period TAB corresponds to M clocks of the clock signal CK2. Here, N and M are integers of 2 or greater, which are different from each other. In FIG. 9, N is set to 17, M is set to 16, and N−M=1 is satisfied. A relationship of TAB=N/f1=M/f2 is established. If f2 is set to 16 MHz, N is set to 17, and M is set to 16, f1 comes to 17 MHz and a relational expression of N/f1=M/f2 is established. The controller 14 controls at least one of the oscillation circuits 101 and 102 so as to establish the relationship of N/f1=M/f2. According to this configuration, the transition timings of the clock signals CK1 and CK2 coincide with each other at the phase synchronization timing TMA, and then the time difference TR (phase difference) between clocks is increased by Δt so as to come to Δt, 2Δt, 3Δt, . . . . Thus, the transition timings of the clock signals CK1 and CK2 coincide with each other at the next phase synchronization timing TMB and thus the time difference TR between clocks is 0. Then, the time difference TR between clocks is increased for each clock cycle by Δt.

As described above, the time difference TR is 0 at the phase synchronization timing and then the time difference TR between clocks is made by increasing the time difference TR by Δt (resolution). Thus, it is possible to realize time-digital conversion in which a time is converted into a digital value at the resolution Δt. In the processing of time-digital conversion at the resolution Δt, as illustrated in FIG. 9, the time difference TR between clocks in each clock cycle (CCT) in the period TAB can be uniquely specified. Thus, the processing of time-digital conversion or a circuit configuration is simplified. The accuracy of time-digital conversion is also improved by causing transition timings of the clock signals CK1 and CK2 to coincide (substantially coincide) with each other at the phase synchronization timings TMA and TMB.

For example, in the above-described method of the related art disclosed in JP-A-5-87954, a method of establishing the relationship of N/f1=M/f2 as a relationship between the clock frequencies on the design of the first and second crystal oscillators is considered. However, the clock frequencies by the first and second crystal oscillators fluctuate due to manufacturing variation or environmental fluctuation such as temperature fluctuation. Thus, even though the relationship of N/f1=M/f2 is established on the design, the relationship of N/f1=M/f2 is not established for practical products. Thus, a shift or the like occurs in the transition timing and conversion accuracy of time-digital conversion is degraded.

On the contrary, in the embodiment, even in a case where the clock frequency fluctuates due to manufacturing variation or environmental fluctuation, the controller 14 controls at least one of the oscillation circuits 101 and 102 so as to cause the clock signals CK1 and CK2 to have a given frequency relationship or phase relationship. Thus, the frequency relationship or the phase relationship between the clock signals CK1 and CK2 is adjusted such that the fluctuation caused by the manufacturing variation or environmental fluctuation is compensated. Thus, even in a case where such fluctuation occurs, it is possible to realize appropriate time-digital conversion. It is possible to prevent degradation of conversion accuracy by shift of the transition timings of the clock signals CK1 and CK2 at the phase synchronization timings TMA and TMB. Thus, the performance of time-digital conversion is improved.

As described above, the controller 14 controls the oscillation circuits so as to establish the relational expression of N/f1=M/f2. The resolution in time-digital conversion is represented by a relational expression of $\Delta t=|f1-f2|/(f1 \times f2)$. Thus, Expression (1) is established.

$$\Delta t = |N-M|/(N \times f2) = |N-M|/(M \times f1) \qquad (1)$$

According to this configuration, the clock signals CK1 and CK2 can be generated by setting N, M, and the like set in accordance with the resolution $\Delta t$ required for time-digital conversion. For example, it is assumed that resolution of $\Delta t=2$ ns (nanoseconds) is required as the resolution in time-digital conversion and the clock frequency f2 of the clock signal CK2 is 100 MHz. In this case, it is possible to realize time-digital conversion at the resolution $\Delta t$ satisfying $|5-4|/(5 \times f2)=2$ ns by setting N to 5 and M to 4 in Expression (1). At this time, the clock frequency f1 of the clock signal CK1 satisfies $(N/M) \times f2=125$ MHz based on the relational expression of N/f1=M/f2. In addition, it is assumed that resolution of $\Delta t=1$ ps (picoseconds) is required as the resolution in time-digital conversion and the clock frequency f2 of the clock signal CK2 is 122.865 MHz. In this case, it is possible to realize time-digital conversion at the resolution $\Delta t$ satisfying $|8139-8138|/(8139 \times f2)=1$ ps by setting N to 8139 and M to 8138 in Expression (1). At this time, the clock frequency f1 of the clock signal CK1 satisfies $(N/M) \times f2=122.880$ MHz based on the relational expression of N/f1=M/f2.

In FIG. 9, after the phase synchronization timing TMA, a time difference TR between clocks, which is a time difference between the transition timings of the clock signals CK1 and CK2 in the first to i-th clock cycles (i is an integer of 2 or greater) is $\Delta t$ to $i \times \Delta t$. For example, TR is $\Delta t$ in the first clock cycle (CCT=1) after the phase synchronization timing TMA. Similarly, TR is $2\Delta t$ to $15\Delta t$ in the second to the 15th clock cycles (CCT=2 to 15). That is, the time difference TR between clocks in the j-th clock cycle ($1 \leq j \leq i$) is $j \times \Delta t$.

In this case, in the embodiment, a digital value DQ corresponding to the time difference TR is obtained by specifying which one of $\Delta t$ to $i \times \Delta t$ as the time difference TR between clocks regarding transition timings of the clock signals CK1 and CK2, the time difference TDF between the transition timings of the signals STA and STP corresponds to. For example, TR is $5\Delta t$ in a clock cycle (CCT=5) indicated by B1 in FIG. 9. The time difference TDF between the signals STA and STP is longer than TR=$5\Delta t$ and TDF>TR=$5\Delta t$ is satisfied. TR is $14\Delta t$ in a clock cycle (CCT=14) indicated by B2. TDF is shorter than TR=$14\Delta t$ and TDF<TR=$14\Delta t$ is satisfied. TR is $10\Delta t$ in a clock cycle (CCT=10) indicated by B3. TDF is equal to (substantially the same as) TR=$10\Delta t$ and TDF=TR=$10\Delta t$ is satisfied. Thus, the time difference TDF between the signals STA and STP is specified to correspond to TR=$10\Delta t$. As a result, it can be determined that the digital value DQ corresponding to the time difference TDF is, for example, a digital value corresponding to TR=$10\Delta t$. According to this configuration, it is possible to realize time-digital conversion in which the time difference TDF between the signals STA and STP is obtained by using the time difference TR between clocks with increasing by $\Delta t$, after the phase synchronization timing TMA.

Figure 10:
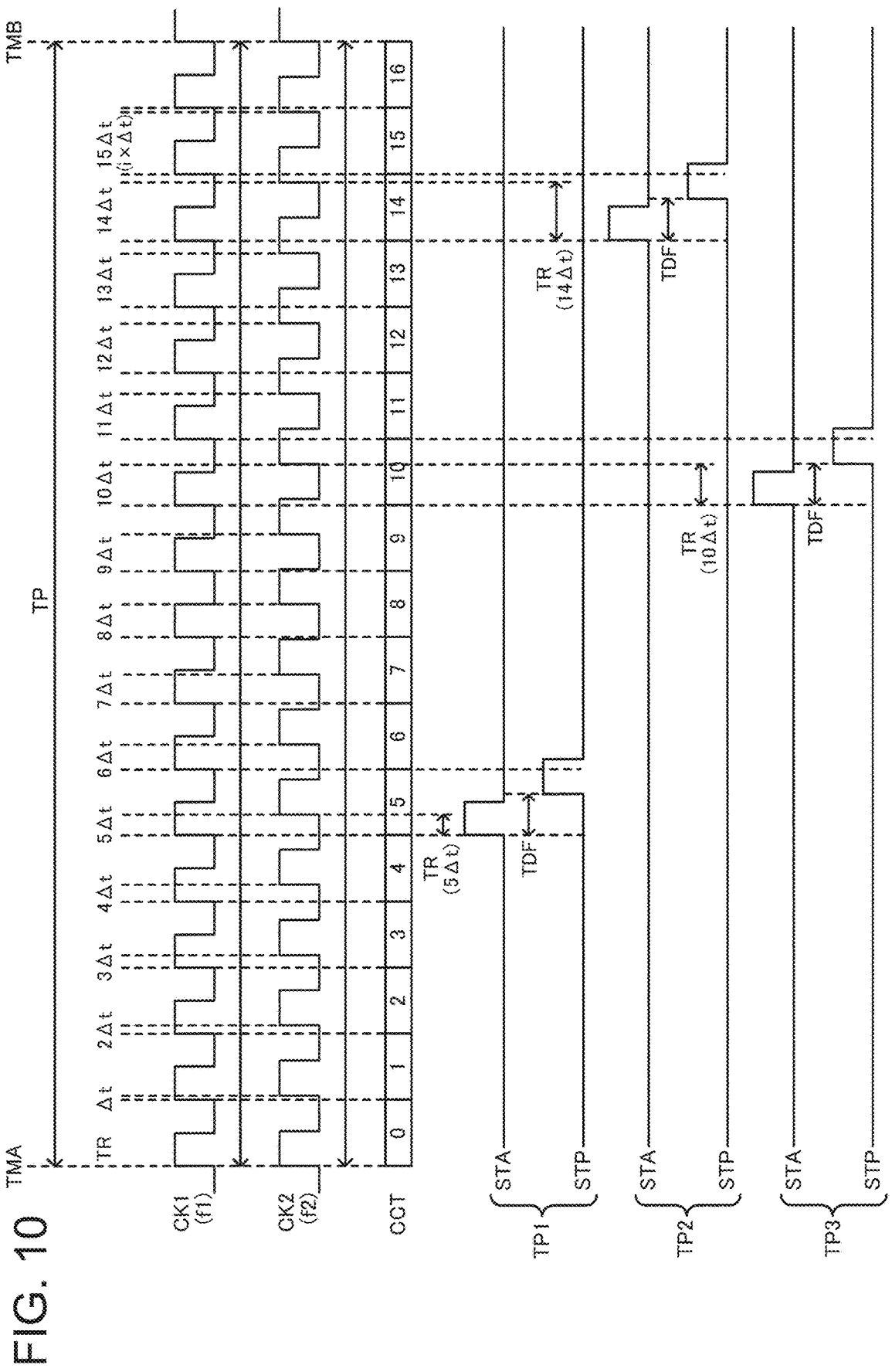
FIG. 10 is a signal waveform diagram illustrating a specific method of time-digital conversion.

FIG. 10 illustrates an example of a specific method of time-digital conversion in the embodiment. For example, a period between the phase synchronization timings TMA and TMB is set to be an update period TP. Specifically, a period between first and second phase synchronization timings for the clock signals CK1 and CK2 is an update period TP1, a period between second and third phase synchronization timings is an update period TP2, and a period between third and fourth phase synchronization timings is an update period TP3. The update period TP2 is an update period next to the update period TP1 and the update period TP3 is an update period next to the update period TP2. The subsequent update periods are similar.

In this case, the time-digital conversion circuit 20 generates the signal STA, for example, in the fifth clock cycle (m-th clock cycle and m is an integer of 1 or greater) in the update period TP1. Then, the time-digital conversion circuit 20 acquires the signal STP which corresponds to the generated signal STA and has a changed signal level. Processing of comparing the time difference TDF between the signals STA and STP in the fifth clock cycle to the time difference TR=$5\Delta t$ between clocks is performed. Here, the result of the comparison processing in that TDF is longer than TR=$5\Delta t$ is obtained.

The time-digital conversion circuit 20 generates the signal STA in the 14th clock cycle (n-th clock cycle and n is an integer of 1 or greater. m and n are integers different from each other) set in accordance with the result of the comparison processing in the update period TP1, in the update period TP2 next to the update period TP1. The time-digital conversion circuit 20 acquires the signal STP which corresponds to the generated signal STA and has a changed signal level. For example, the result of comparison processing in that TDF is longer than TR=$5\Delta t$ is obtained in the update period TP1. Therefore, a clock cycle is set to cause TR to increase, in the next update period TP2. For example, the time-digital conversion circuit 20 generates the signal STA in the fifth clock cycle causing TR=$5\Delta t$, in the update period TP1, but generates the signal STA in the 14th clock cycle causing TR=$14\Delta t$, in the update period TP2. Processing of comparing TDF in the 14th clock cycle to TR=$14\Delta t$ is performed. Here, the result of the comparison processing in that TDF is shorter than TR=$14\Delta t$ is obtained.

The time-digital conversion circuit 20 generates the signal STA in the 10th clock cycle (CCT=10) set in accordance with the result of the comparison processing in the update period TP2, in the update period TP3 next to the update period TP2. For example, the result of the comparison processing in that TDF is shorter than TR=14Δt is obtained in the update period TP2. Thus, a clock cycle causing TR to be much shorter is set. For example, the time-digital conversion circuit 20 generates the signal STA in the 10th clock cycle causing TR=10Δt. Processing of comparing TDF in the 10th clock cycle to TR=10Δt is performed. Here, the result of the comparison processing in that TDF is the same (substantially the same) as TR=10Δt is obtained. Thus, it is determined that the digital value DQ corresponding to the time difference TDF is a digital value corresponding to TR=10Δt.

As described above, in FIG. 10, feedback of the result of the comparison processing in the previous update period is performed so as to set a clock cycle for generating the signal STA in the current update period. Then, the comparison processing between TDF and TR is performed. As described above, it is possible to increase the speed of time-digital conversion by performing feedback of the result of the comparison processing in the previous update period. Even in a case where the time or the physical quantity as a measurement target changes dynamically, it is possible to realize time-digital conversion following the dynamic change.

Various modifications of time-digital conversion in the embodiment may be made. For example, a method (repetitive method) of obtaining the digital value DQ corresponding to the time difference TDF in a manner that the signal STA is generated plural times in one measurement period in which time is measured and phase comparison is performed plural times (for example, 1000 times or greater) may be employed. Alternatively, in FIG. 10, a clock cycle designation value (clock cycle designation information) for designating a clock cycle in which the signal STA is generated is stored in the storage unit (register) of the integrated circuit device 10. A method of obtaining the digital value DQ corresponding to the time difference TDF (the method of updating a clock cycle designation value) in a manner that processing of sequentially updating the clock cycle designation value stored in the storage unit is performed based on a result obtained by performing phase comparison between the signal STP and the clock signal CK2 in each of update periods TP1, TP2, TP3, . . . may be employed. Alternatively, a method (the binary search method) of obtaining the digital value DQ corresponding to the time difference TDF between the transition timings of the signals STA and STP, at resolution corresponding to the frequency difference between the clock frequencies f1 and f2 by binary search may be employed. Specifically, update of the clock cycle designation value based on the phase comparison result between the signal STP and the clock signal CK2 is realized by binary search. Alternatively, a search range of the digital value DQ may be narrowed by the method of binary search. Then, the signal STA may be generated for each clock cycle and phase comparison may be performed, by the method of updating the clock cycle designation value, in a period corresponding to the narrowed search range. Finally, the digital value DQ may be obtained. Alternatively, the digital value DQ corresponding to the time difference TDF between the transition timings of the signals STA and STP may be obtained based on the clock signals CK1 and CK2 generated by the resonators XTAL1 and XTAL2 and the signal STA which is input from the outside of the integrated circuit device 10 instead of spontaneously generating the signal STA in the integrated circuit device 10. For example, time-digital conversion may be performed while the oscillation circuits 101 and 102 perform an oscillation operation of the resonators XTAL1 and XTAL2 in a manner of free run.

4. Detailed Configuration Example of Integrated Circuit Device

Figure 11:
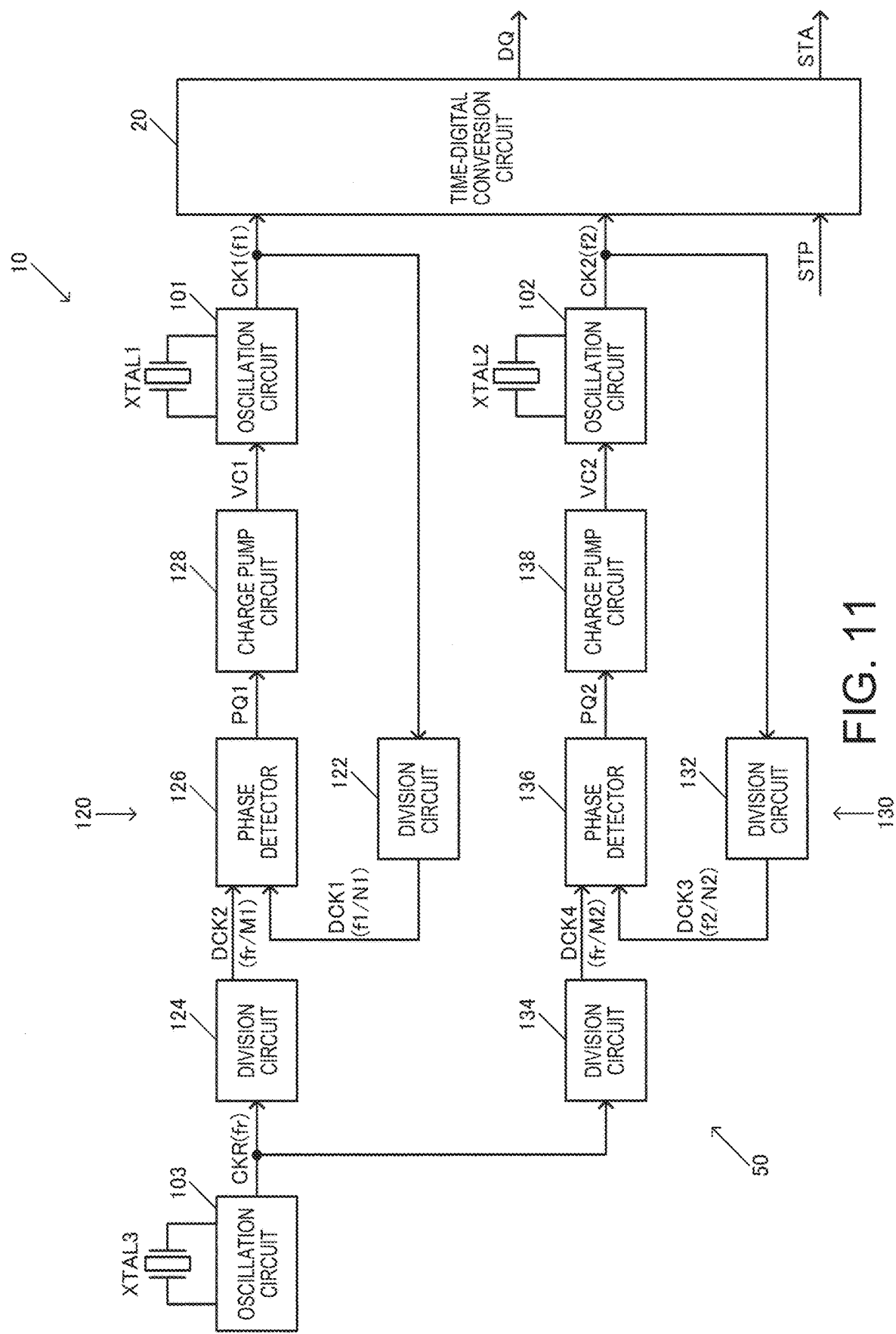
FIG. 11 illustrates a detailed configuration example of the integrated circuit device and the resonator device.

FIG. 11 illustrates a detailed configuration example of the integrated circuit device 10. The integrated circuit device 10 in FIG. 11 includes the PLL circuit (first PLL circuit) 120 and the PLL circuit (second PLL circuit) 130. The PLL circuit 120 performs phase synchronization between the clock signal CK1 and the reference clock signal CKR. The PLL circuit 130 performs phase synchronization between the clock signal CK2 and the reference clock signal CKR. The integrated circuit device 10 includes the oscillation circuit 103 that oscillates the resonator XTAL3. Specifically, the PLL circuit 120 performs phase synchronization between the clock signal CK1 and the reference clock signal CKR (causes the transition timings thereof to coincide with each other) for each first phase synchronization timing (for each first period). The PLL circuit 130 performs phase synchronization between the clock signal CK2 and the reference clock signal CKR (causes the transition timings thereof to coincide with each other) for each second phase synchronization timing (for each second period).

The reference clock signal CKR is generated by the oscillation circuit 103 oscillating the resonator XTAL3. The clock frequency fr of the reference clock signal CKR is a frequency different from the clock frequencies f1 and f2 of the clock signals CK1 and CK2. For example, the clock frequency fr is lower than the clock frequencies f1 and f2. The reference clock signal CKR which has small jitter or a small phase error and has high precision can be generated by using a crystal resonator as the resonator XTAL3. Consequently, it is possible to reduce jitter or a phase error of the clock signals CK1 and CK2 and accuracy of time-digital conversion is improved.

As described above, in the configuration example in FIG. 11, phase synchronization is performed on the clock signal CK1 and the reference clock signal CKR by the PLL circuit 120 and phase synchronization is performed on the clock signal CK2 and the reference clock signal CKR by the PLL circuit 130. Thus, phase synchronization between the clock signals CK1 and CK2 is performed.

Specifically, the PLL circuit 120 includes division circuits 122 and 124 and a phase detector 126. The division circuit 122 divides the clock frequency f1 of the clock signal CK1 by N1 and outputs a divided clock signal DCK1 having a clock frequency of f1/N1. The division circuit 124 divides the clock frequency fr of the reference clock signal CKR by M1 and outputs a divided clock signal DCK2 having a clock frequency of fr/M1. The phase detector 126 performs phase comparison between DCK1 and DCK2 and outputs a signal PQ1 which is an up or down signal, to a charge pump circuit 128. The oscillation circuit (VCXO) 101 generates the clock signal CK1 by performing an oscillation operation of the resonator XTAL1 having an oscillation frequency which is controlled based on a control voltage VC1 from the charge pump circuit 128.

The PLL circuit 130 includes division circuits 132 and 134 and a phase detector 136. The division circuit 132 divides the clock frequency f2 of the clock signal CK2 by N2 and outputs a divided clock signal DCK3 having a clock frequency of f2/N2. The division circuit 134 divides the clock frequency fr of the reference clock signal CKR by M2 and outputs a divided clock signal DCK4 having a clock frequency of fr/M2. The phase detector 136 performs phase comparison between DCK3 and DCK4 and outputs a signal PQ2 which is an up or down signal, to the charge pump circuit 138. The oscillation circuit (VCXO) 102 generates the clock signal CK2 by performing an oscillation operation of the resonator XTAL2 having an oscillation frequency which is controlled based on a control voltage VC2 from the charge pump circuit 138.

Figure 12:
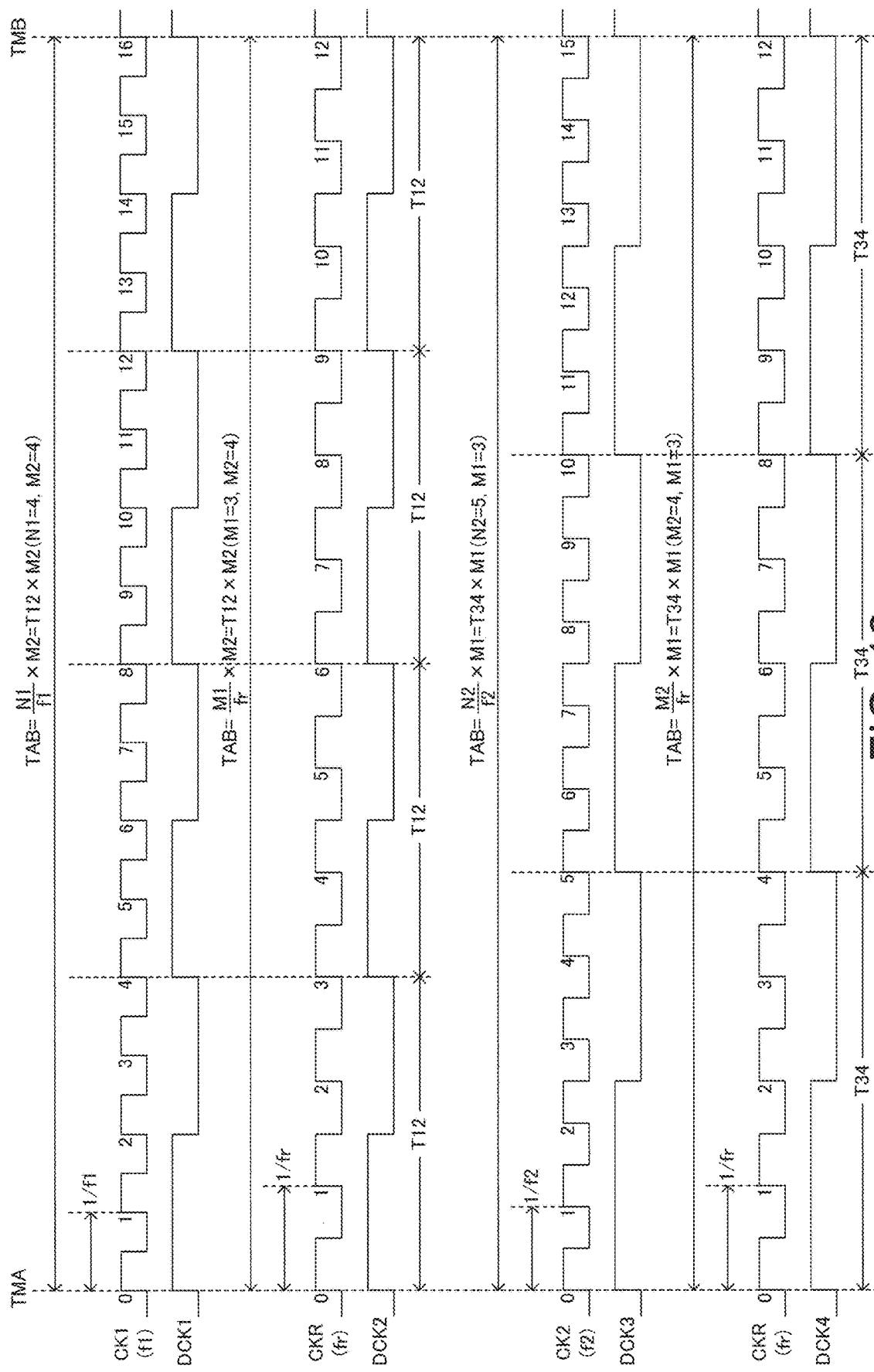
FIG. 12 is a signal waveform diagram illustrating time-digital conversion in the detailed configuration example.

FIG. 12 is a signal waveform diagram illustrating an operation of the integrated circuit device 10 in FIG. 11. FIG. 12 illustrates an example in which N1=4, M1=3, N2=5, and M2=4 are set for simple descriptions. In practice, N1, M1, N2, and M2 are set to have very large values.

As illustrated in FIG. 12, a signal obtained by dividing CK1 by N1 (=4) corresponds to DCK1, a signal obtained by dividing CKR by M1 (=3) corresponds to DCK2, and phase synchronization is performed for each period T12. That is, phase synchronization between CK1 and CKR is performed by the PLL circuit 120, so as to establish the relationship of T12=N1/f1=M1/fr. A signal obtained by dividing CK2 by N2 (=5) corresponds to DCK3, a signal obtained by dividing CKR by M2 (=4) corresponds to DCK4, and phase synchronization is performed for each period T34. That is, phase synchronization between CK2 and CKR is performed by the PLL circuit 130, so as to establish the relationship of T34=N2/f2=M2/fr. As described above, phase synchronization is performed on CK1 and CK2 for each period TAB by performing phase synchronization on CK1 and CKR for each period T12 and performing phase synchronization on CK2 and CKR for each period T34. Here, a relationship of TAB=T12×M2=T34×M1 is established. For example, in a case of M2=4 and M1=3, TAB=T12×4=T34×3 is established.

Division ratios N1, M1, N2, and M2 of the division circuits 122, 124, 132, and 134 in FIG. 11 are set to have very large values in practice. For example, in a case where the clock frequency fr of the reference clock signal CKR is 101 MHz, the division ratios are set to be N1=101 and M1=100, and thus the PLL circuit 120 generates the clock signal CK1 having a clock frequency f1 of 102.01 MHz. Since the division ratios are set to be N2=102 and M2=101, the PLL circuit 130 generates the clock signal CK2 having a clock frequency f2 of 102 MHz. Thus, the resolution in time-digital conversion can be set to $\Delta t=|1/f1-1/f2|=0.96$ ps (picoseconds) and it is possible to realize time-digital conversion having high resolution.

N1 and M1 are integers which are 2 or greater and are different from each other. N2 and M2 are also integers which are 2 or greater and are different from each other. At least one of N1 and M1 and at least one of N2 and M2 are integers different from each other. Desirably, for N1 and N2, the greatest common divisor is 1 and the least common multiple is N1×N2. For M1 and M2, the greatest common divisor is 1 and the least common multiple is M1×M2. In the embodiment, N1, M1, N2, and M2 are set to establish a relationship of |N1×M2−N2×M1|=1. With an example in FIG. 12, in which N1=4, M1=3, N2=5, and M2=4 are set, |N1×M2−N2×M1|=|4×4−5×3|=1 is satisfied. This means that the length of 16 clocks of CK1 is equal to the length of 15 clocks of CK2. According to this configuration, CK1 and CK2 are shifted for each period TAB by one clock cycle (one clock period) and thus it is possible to realize time-digital conversion by using the principle of a Vernier caliper.

In FIGS. 11 and 12, phase synchronization between CK1 and CKR is performed for each period T12 which is shorter than the period TAB, and phase synchronization between CK2 and CKR is performed for each period T34 which is shorter than the period TAB. Thus, in comparison to a configuration example which will be described later and in which only one PLL circuit is provided, the frequency of performing phase comparison is increased and thus an occurrence of jitter (cumulative jitter) or phase noise in the clock signals CK1 and CK2 is reduced. In particular, in a case where N1, M1, N2, and M2 are set to large numbers for realizing high resolution Δt, in the configuration example in which only one PLL circuit is provided, the length of the period TAB is very long. In addition, jitter or a phase error occurs largely by accumulating errors. On the contrary, in FIGS. 11 and 12, phase comparison is performed for each period T12 or T34 which is shorter than the period TAB. Thus, it is possible to reduce a cumulative error and to reduce the occurrence of jitter or a phase error.

The PLL circuits 120 and 130 in FIG. 11 have a circuit configuration of an analog type. However, a circuit configuration of a digital type (ADPLL) may be employed. In this case, it is possible to embody each of the PLL circuits (120 and 130) by a phase detector, a digital computation unit, and the like. The phase detector includes a counter and a TDC. The counter generates digital data corresponding to an integer part of a result obtained by dividing the clock frequency (fr) of the reference clock signal (CKR) by the clock frequency (f1, f2) of the clock signal (CK1, CK2). The TDC generates digital data corresponding to a decimal part of the division result. Digital data corresponding to a result obtained by adding the integer part and the decimal part is output to the digital computation unit. The digital computation unit detects a phase error from setting frequency data based on setting frequency data (FCW1, FCW2) and digital data of a comparison result from the phase detector. Then, the digital computation unit generates frequency control data by performing smoothing processing of the detected phase error and outputs the generated frequency control data to the oscillation circuit (101, 102). The oscillation circuit generates a clock signal (CK1, CK2) having an oscillation frequency which is controlled based on the frequency control data.

5. Oscillation Circuit

FIG. 13 illustrates a first configuration example of the oscillation circuit 100. Here, the oscillation circuit 100 is described as the representative of the oscillation circuits 101, 102, and 103. The oscillation circuit 100 in FIG. 13 includes an oscillation buffer circuit BAB, variable capacitance circuits CB1 and CB2 (capacitors) and a feedback resistor RB. The buffer circuit BAB can be configured by an inverter circuit having one or a plurality of stages (odd number stages). In FIG. 13, the buffer circuit BAB is configured by an inverter circuit having three stages (IV1, IV2, and IV3). The buffer circuit BAB (IV1 to IV3) may be a circuit capable of controlling enabling or disabling of oscillation or controlling a current to flow.

The variable capacitance circuits CB1 and CB2 are provided at one end (NB1) and the other end (NB2) of the resonator XTAL, respectively. The feedback resistor RB is provided between the one end and the other end of the resonator XTAL. The variable capacitance circuits CB1 and CB2 controls the capacitance values based on control voltages (control signal) VC1 and VC2. The variable capacitance circuits CB1 and CB2 are realized by variable capacitance diodes (varactors) or the like. As described above, it is possible to adjust the oscillation frequency of the oscillation circuit 100 by controlling the capacitance value.

FIG. 14 illustrates a second configuration example of the oscillation circuit 100. The oscillation circuit 100 includes a current source IBX, a bipolar transistor TRX, a resistor RX, capacitors CX2 and CX3, and a variable capacitance circuit CX1 (variable capacitor). For example, the oscillation buffer circuit BAX is configured by the current source IBX, the bipolar transistor TRX, the resistor RX, and the capacitor CX3. The current source IBX supplies a bias current to a collector of the bipolar transistor TRX. The resistor RX is provided between the collector and a base of the bipolar transistor TRX. One end of the variable capacitance circuit CX1 in which capacitance is variable is connected to one end (NX1) of the resonator XTAL via a first terminal for a resonator (pad for resonator) in the integrated circuit device 10. One end of the capacitor CX2 is connected to the other end (NX2) of the resonator XTAL via a second terminal for a resonator (pad for resonator) in the integrated circuit device 10. One end of the capacitor CX3 is connected to one end of the resonator XTAL and the other end of the capacitor CX3 is connected to the collector of the bipolar transistor TRX.

A base-emitter current generated by oscillating the resonator XTAL flows in the bipolar transistor TRX. If the base-emitter current increases, a collector-emitter current of TRX increases and a collector voltage VCX decreases. If the base-emitter current of TRX decreases, the collector-emitter current decreases and the collector voltage VCX increases. The collector voltage VCX is fed back to the one end of the resonator XTAL via the capacitor CX3. That is, an AC component is cut off by the capacitor CX3 and a DC component is fed back. As described above, the oscillation buffer circuit BAX configured by the bipolar transistor TRX and the like operates as an inverting circuit (inverting amplifier circuit) that outputs an inverted signal (signal having a phase difference of 180 degrees) of a signal at a node NX2, to a node NX1. The capacitance value of the variable capacitance circuit CX1 configured by the variable capacitance diode and the like is controlled based on the control voltage VC. Thus, the oscillation frequency of the oscillation circuit 100 may be adjusted.

The oscillation circuit 100 is not limited to the configurations in FIGS. 13 and 14. Various modifications may be made. For example, the capacitance values of the variable capacitance circuits (CB1, CB2, and CX1) can be adjusted by using digital values. In this case, the variable capacitance circuit is configured by a plurality of capacitors (capacitor array) and a plurality of switching elements (switching array). ON and OFF of each of the switching elements are controlled based on frequency control data having a digital value.

6. Modification Example

Next, various modification examples of the embodiment will be described. For example, in the embodiment, a case of providing the three resonators XTAL1 to XTAL3 is mainly described. However, the embodiment is not limited thereto. The number of resonators may be 2 or may be 4 or greater. For example, in the first modification example of the embodiment in FIG. 15, the two resonators XTAL1 and XTAL2 and one PLL circuit 120 are provided.

For example, the PLL circuit 120 performs phase synchronization between the clock signals CK1 and CK2. Specifically, in a case where the clock frequencies of the clock signals CK1 and CK2 are set to f1 and f2, the PLL circuit 120 performs phase synchronization between the clock signals CK1 and CK2 so as to satisfy N/f1=M/f2 (N and M are integers of 2 or greater, which are different from each other). The PLL circuit 120 includes the division circuits 122 and 124 and the phase detector 126. The division circuit 122 divides the clock frequency f1 of the clock signal CK1 by N and outputs a divided clock signal DCK1 having a clock frequency of f1/N. The division circuit 124 divides the clock frequency f2 of the clock signal CK2 by M and outputs a divided clock signal DCK2 having a clock frequency of f2/M. For example, the integrated circuit device 10 includes the oscillation circuit 102. The oscillation circuit 102 oscillates the resonator XTAL2 to generate the clock signal CK2 and outputs the generated clock signal CK2 to the division circuit 124. The phase detector 126 performs phase comparison between the divided clock signal DCK1 and the divided clock signal DCK2. With this configuration, it is possible to perform phase synchronization between the clock signals CK1 and CK2 for each phase synchronization timing.

Figure 16:
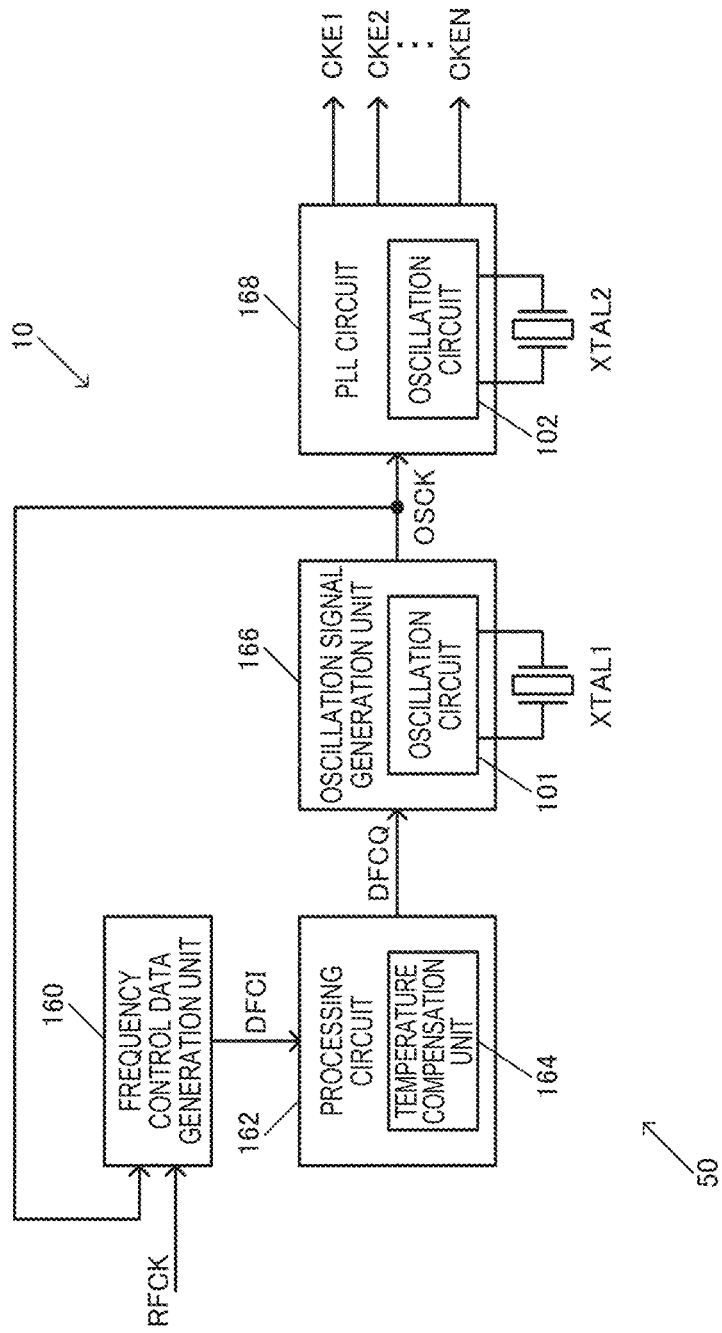
FIG. 16 illustrates a second modification example of the embodiment.

In the embodiment, a case where the resonator device (integrated circuit device 10) performs time-digital conversion is mainly described. However, the embodiment is not limited thereto. For example, the second modification example in FIG. 16 is a configuration example in a case where the resonator device 50 is a temperature compensated oscillator such as an OCXO and a TCXO. The integrated circuit device 10 of such a resonator device 50 includes a frequency control data generation unit 160, a processing circuit 162 including a temperature compensation unit 164, an oscillation signal generation unit 166 including the oscillation circuit 101, and a PLL circuit 168 including the oscillation circuit 102.

The frequency control data generation unit 160 compares an oscillation signal OSCK and a reference signal RFCK and generates frequency control data DFCI. For example, in a case where the frequency of the oscillation signal OSCK is set as FOS, the frequency of the reference signal RFCK is set as FRF, the number of divisions (division ratio) corresponding to the setting frequency is set as FCW, the frequency control data generation unit 160 generates the frequency control data DFCI so as to establish a relationship of FOS=FCW×FRF. The processing circuit 162 performs signal processing such as temperature compensation processing and aging correction processing, on the frequency control data (frequency control code) DFCI from the frequency control data generation unit 160. Then, the processing circuit 162 outputs frequency control data DFCQ after the signal processing. The oscillation signal generation unit 166 generates the oscillation signal OSCK in a manner that the frequency control data DFCQ is input from the processing circuit 162 and the resonator XTAL1 is oscillated at an oscillation frequency set by the frequency control data DFCQ. The oscillation signal OSCK is generated by the oscillation circuit 101 that oscillates the resonator XTAL1. Here, the resonator XTAL1 is a resonator provided in an oven of an oven type oscillator (OCXO), for example. However, it is not limited thereto and a resonator for TCXO, which has a type that does not include an oven, may be provided.

The PLL circuit (clock signal generation unit) 168 generates clock signal CK1 to CKEN by performing phase synchronization on the oscillation signal OSCK if the oscillation signal OSCK is input. For example, the PLL circuit 168 includes a phase detector (phase comparator) and the oscillation circuit 102 that oscillates the resonator XTAL2 as a VCXO. The PLL circuit 168 generates clock signals CK1 to CKEN having a frequency obtained by multiplying the oscillation frequency of the oscillation signal OSCK. The clock signals CK1 to CKEN are output as various clock signals used by a device (base station and the like) in which an oscillator (OCXO) which is the resonator device 50 is provided.

Figure 15:
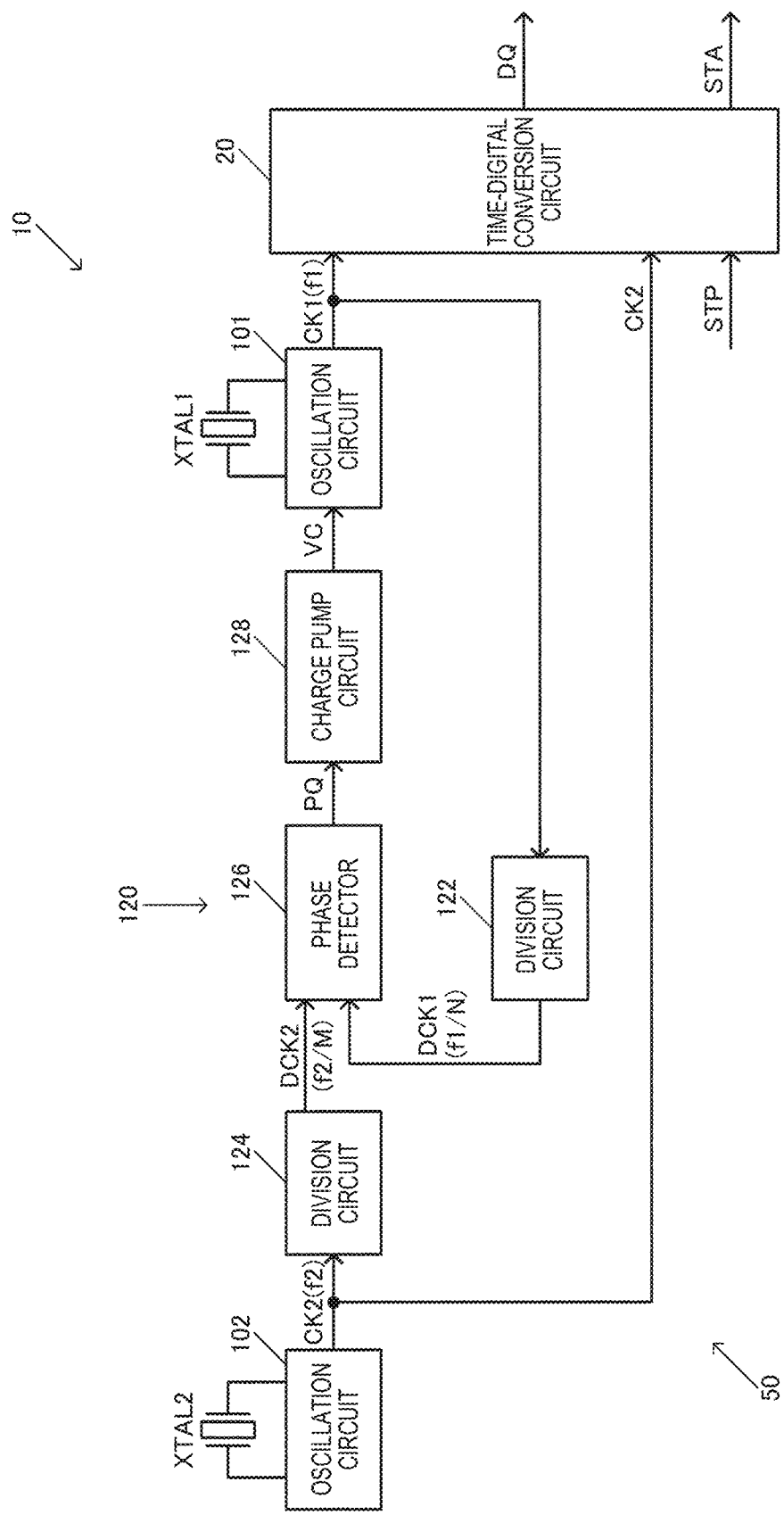
FIG. 15 illustrates a first modification example of the embodiment.

Even in the modification examples in FIGS. 15 and 16, a plurality of resonators XTAL1 and XTAL2 are provided in the resonator device 50. The resonators XTAL1 and XTAL2 are mounted on the integrated circuit device 10 while being supported by the support portion such as a bump connection portion. With this configuration, it is possible to realize time-digital conversion having high accuracy or to realize an oscillator that generates a clock signal having a high precision.

7. Electronic Apparatus and Vehicle

Figure 17:
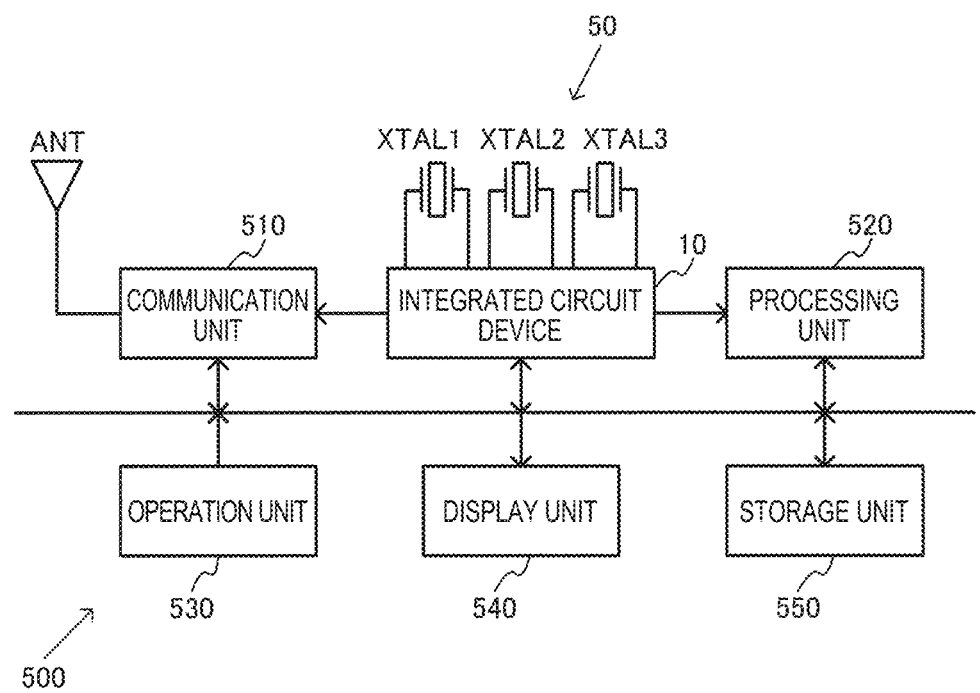
FIG. 17 illustrates a configuration example of an electronic apparatus.

FIG. 17 illustrates a configuration example of an electronic apparatus 500 including the resonator device 50 (integrated circuit device 10) in the embodiment. The electronic apparatus 500 includes the resonator device 50 including the integrated circuit device 10 and the resonators XTAL1 to XTAL3, and a processing unit 520. The electronic apparatus 500 may include a communication unit 510, an operation unit 530, a display unit 540, a storage unit 550, and an antenna ANT.

As the electronic apparatus 500, for example, the followings can be assumed: a measuring device that measures the physical quantity such as a distance, a time, a flow rate, and a flow quantity; a biological information measuring device that measures biological information (ultrasonic measuring device, pulse wave meter, blood pressure measuring device, and the like); an in-vehicle device (device for automatic driving and the like); and a network-related device such as a base station or a router. In addition, the followings can be assumed: a wearable device such as a head-mounted display device or a clock-related device; a robot, a printing device, a projection device, a portable information terminal (such as a smartphone), a content providing device that distributes contents; and a video device such as a digital camera or a video camera.

The communication unit (wireless circuit) 510 performs processing of receiving data from the outside or transmitting data to the outside, via the antenna ANT. The processing unit (processing circuit) 520 performs control processing of the electronic apparatus 500 or various kinds of digital processing of data transmitted and received via the communication unit 510. The function of the processing unit 520 may be realized by a processor such as a microcomputer, for example. The operation unit 530 is used when a user performs an input operation. The operation unit 530 may be realized by an operation button, a touch panel display, and the like. The display unit 540 displays various kinds of information and may be realized by a display of liquid crystal, organic EL, or the like. The storage unit 550 stores data. The function thereof may be realized by a semiconductor memory (such as an RAM or an ROM), an HDD (hard disk drive), or the like.

Figure 18:
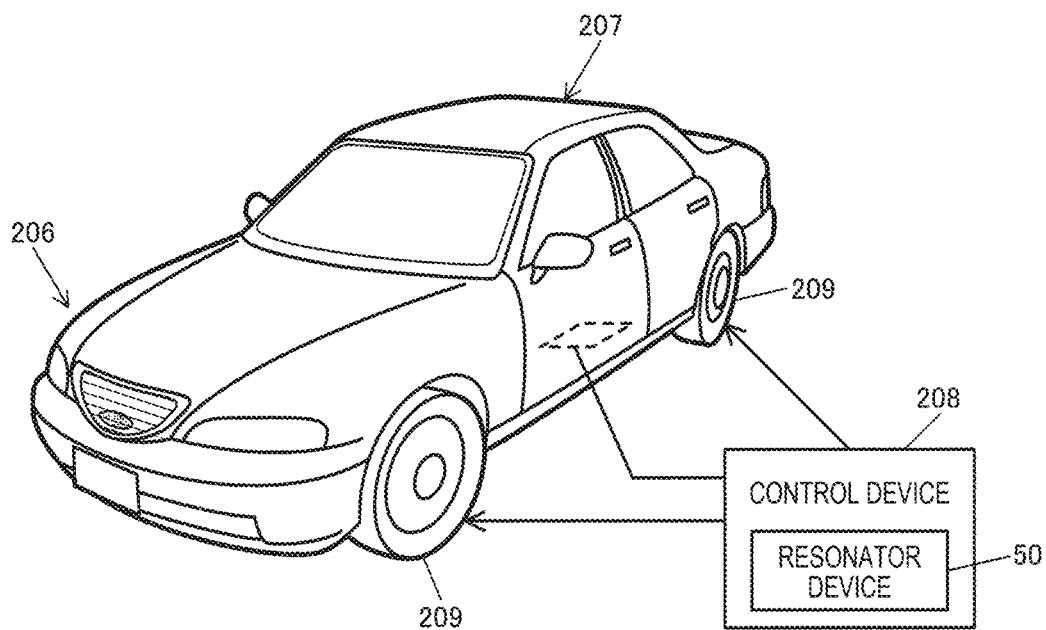
FIG. 18 illustrates a configuration example of a vehicle.

FIG. 18 illustrates an example of a vehicle including the resonator device 50 (integrated circuit device 10) in the embodiment. The resonator device 50 (oscillator, physical quantity measurement device) in the embodiment can be incorporated into various vehicles such as cars, airplanes, motorcycles, bicycles, robots, and ships. The vehicle is equipment or a device that includes a driving mechanism such as an engine and a motor, a steering mechanism such as a steering wheel and a rudder, and various kinds of electronic apparatuses (in-vehicle equipment) and moves on the ground, the sky, or the sea. FIG. 18 schematically illustrates an automobile 206 as a specific example of the vehicle. The resonator device 50 in the embodiment is incorporated into the automobile 206. A control device 208 performs various kinds of control processing based on the clock signal generated by the resonator device 50 or physical quantity information measured by the resonator device 50. For example, in a case where distance information of an object around the automobile 206 is measured as the physical quantity information, the control device 208 performs various kinds of control processing for automatic driving, by using the measured distance information. The control device 208 controls the hardness of a suspension in accordance with the posture of a vehicle body 207 or controls the break for each wheel 209. A device into which the resonator device 50 in the embodiment is incorporated is not limited to such a control device 208. The resonator device 50 can be incorporated into various devices provided in a vehicle such as the automobile 206 or a robot.

Hitherto, preferred embodiments have been specifically described. However, those skilled in the related art can easily understand that many modifications can be made without substantially departing from the novel matters and effects of the invention. Thus, all such modification examples are included in the scope of the invention. For example, in the specification or the drawings, at least once a term described together with a different term which is broader, or equivalent can be replaced with the different term at any point in the specification or the drawings. In addition, all combinations of the embodiment and the modification examples are included in the scope of the invention. The configurations and operations of the resonator device, the electronic apparatus, and the vehicle, an arrangement configuration or a connection configuration of the integrated circuit device and the resonator in the resonator device, the circuit configuration of the integrated circuit device, and the processing and the like of the processing circuit are not limited to those described in the embodiment and various modifications can be made.

The entire disclosure of Japanese Patent Application No. 2017-126937 filed Jun. 29, 2017 is expressly incorporated by reference herein.

What is claimed is:

1. A resonator device comprising:
a first resonator;
a second resonator; and
an integrated circuit including:
  a first oscillation circuit that oscillates the first resonator,
  a second oscillation circuit that oscillates the second resonator,
  a first terminal electrically connected to the first oscillation circuit,
  a second terminal electrically connected to the first oscillation circuit,
  a third terminal electrically connected to the second oscillation circuit, and
  a fourth terminal electrically connected to the second oscillation circuit,
wherein the first terminal of the integrated circuit and one electrode of the first resonator are connected to each other via a bump,
the third terminal of the integrated circuit and one electrode of the second resonator are connected to each other via a bump,
at least a portion of the first resonator overlaps the first oscillation circuit in a plan view, and
at least a portion of the second resonator overlaps the second oscillation circuit in the plan view,
wherein at least one of:
  the second terminal of the integrated circuit and another electrode of the first resonator; or
  the fourth terminal of the integrated circuit and another electrode of the second resonator,
are connected by a bonding wire.

2. The resonator device according to claim 1,
wherein the second terminal of the integrated circuit and a terminal electrode of the other electrode of the first resonator are connected to each other by a first bonding wire, and
the terminal electrode of the other electrode of the first resonator and a terminal electrode of the one electrode thereof overlap the first terminal of the integrated circuit in the plan view.

3. The resonator device according to claim 2,
wherein the fourth terminal of the integrated circuit and a terminal electrode of the other electrode of the second resonator are connected to each other by a second bonding wire, and
the terminal electrode of the other electrode of the second resonator and a terminal electrode of the one electrode thereof overlap the third terminal of the integrated circuit in the plan view.

4. The resonator device according to claim 1,
wherein at least one of:
the second terminal of the integrated circuit and the one electrode of the first resonator; or
the fourth terminal of the integrated circuit and the one electrode of the second resonator,
are connected via a bump.

5. The resonator device according to claim 1, further comprising:
a third resonator,
wherein the integrated circuit includes:
a third oscillation circuit that oscillates the third resonator,
a fifth terminal that electrically connects the third resonator and the third oscillation circuit, and
a sixth terminal that electrically connects the third resonator and the third oscillation circuit, and
the fifth terminal of the integrated circuit and one electrode of the third resonator are connected to each other via a bump.

6. The resonator device according to claim 5,
wherein the first resonator and the second resonator are oriented on the integrated circuit so as to be longitudinally extended in a first direction in the plan view, and
the third resonator is oriented on the integrated circuit so as to be longitudinally extended in a second direction in the plan view, the second direction intersecting with the first direction.

7. The resonator device according to claim 1,
wherein the second terminal of the integrated circuit and a terminal electrode of the other electrode of the first resonator connected to the second terminal are disposed with a side of the first resonator interposed therebetween, the side being closest to the second terminal among all sides of the first resonator, in the plan view.

8. The resonator device according to claim 1,
wherein the fourth terminal of the integrated circuit and a terminal electrode of the other electrode of the second resonator connected to the fourth terminal are disposed with a side of the second resonator interposed therebetween, the side being closest to the fourth terminal among all sides of the second resonator, in the plan view.

9. The resonator device according to claim 1,
wherein the integrated circuit includes a processing circuit configured to perform processing based on a first clock signal generated by oscillating the first resonator and a second clock signal generated by oscillating the second resonator.

10. The resonator device according to claim 9,
wherein the processing circuit includes a controller configured to control at least one of an oscillation frequency and a phase of an oscillation signal from at least one of the first oscillation circuit and the second oscillation circuit.

11. The resonator device according to claim 9,
wherein the processing circuit includes a time-digital conversion circuit configured to convert a time to a digital value based on the first clock signal and the second clock signal.

12. The resonator device according to claim 9,
wherein the processing circuit includes a frequency corrector configured to perform frequency correction based on frequency difference information or frequency comparison information between the first clock signal and the second clock signal.

13. A resonator device comprising:
a substantially rectangular integrated circuit including:
first and second oscillation circuits respectively disposed proximate major sides of the integrated circuit;
first and second terminals adjacent and electrically connected to the first oscillation circuit; and
third and fourth terminals adjacent and electrically connected to the second oscillation circuit;
a first resonator mounted on the integrated circuit so as to entirely overlap the first oscillation circuit in a plan view;
a first bump upstandingly interconnecting one electrode of the first resonator and the first terminal of the integrated circuit;
a second resonator mounted on the integrated circuit so as to entirely overlap the second oscillation circuit in the plan view; and
a second bump upstandingly interconnecting one electrode of the second resonator and the third terminal of the integrated circuit,
wherein the first oscillation circuit oscillates the first resonator, and
the second oscillation circuit oscillates the second resonator,
wherein the second terminal of the integrated circuit and another electrode of the first resonator are connected by a bonding wire; and
the fourth terminal of the integrated circuit and another electrode of the second resonator are connected by a bonding wire.

14. The resonator device according to claim 13,
wherein the second terminal of the integrated circuit and a terminal electrode of the other electrode of the first resonator are connected to each other by a first bonding wire, and
the terminal electrode of the other electrode of the first resonator and a terminal electrode of the one electrode thereof overlap the first terminal of the integrated circuit in the plan view.

15. The resonator device according to claim 14,
wherein the fourth terminal of the integrated circuit and a terminal electrode of the other electrode of the second resonator are connected to each other by a second bonding wire, and the terminal electrode of the other electrode of the second resonator and a terminal electrode of the one electrode thereof overlap the third terminal of the integrated circuit in the plan view.

16. The resonator device according to claim 13,
wherein the second terminal of the integrated circuit and the one electrode of the first resonator are connected via a bump; and
the fourth terminal of the integrated circuit and the one electrode of the second resonator are connected via a bump.

17. The resonator device according to claim 13,
wherein the integrated circuit further includes:
   a third oscillation circuit disposed proximate a minor side of the integrated circuit; and
   fifth and sixth terminals adjacent and electrically connected to the third oscillation circuit, and further comprising:
   a third resonator mounted on the integrated circuit so as to at least partially overlap the third oscillation circuit; and
   a third bump upstandingly interconnecting the fifth terminal of the integrated circuit and one electrode of the third resonator,
wherein the third oscillation circuit oscillates the third resonator.

18. The resonator device according to claim 17,
wherein the first resonator and the second resonator are oriented on the integrated circuit so as to be longitudinally extended in a first direction parallel to the major sides in the plan view, and
the third resonator is oriented on the integrated circuit so as to be longitudinally extended in a second direction parallel to the minor side in the plan view.

* * * * *